US008571513B2

(12) United States Patent
O'Mahony et al.

(10) Patent No.: US 8,571,513 B2
(45) Date of Patent: Oct. 29, 2013

(54) INTEGRATED CIRCUIT PASSIVE SIGNAL DISTRIBUTION

(75) Inventors: Frank O'Mahony, Portland, OR (US); Bryan Casper, Hillsboro, OR (US); James Jaussi, Hillsboro, OR (US); Matthew B. Haycock, Beaverton, OR (US); Joseph Kennedy, Beaverton, OR (US); Mozhgan Mansuri, Hillsboro, OR (US); Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/540,500

(22) Filed: Jul. 2, 2012

(65) Prior Publication Data

US 2012/0281323 A1    Nov. 8, 2012

Related U.S. Application Data

(63) Continuation of application No. 11/323,370, filed on Dec. 29, 2005, now Pat. No. 8,213,894.

(51) Int. Cl.
*H04B 1/28*    (2006.01)
(52) U.S. Cl.
USPC .......... 455/333; 455/14; 455/282; 455/343.1; 455/323; 326/30; 361/91.1
(58) Field of Classification Search
USPC .......... 455/333, 14, 282, 343.1, 323; 326/30; 361/91.1
See application file for complete search history.

(56) References Cited

U.S. PATENT DOCUMENTS

| | | | |
|---|---|---|---|
| 5,481,207 A | 1/1996 | Crafts | |
| 5,548,226 A | 8/1996 | Takekuma et al. | |
| 5,604,450 A | 2/1997 | Borkar et al. | |
| 5,668,834 A | 9/1997 | Takekuma et al. | |
| 5,982,192 A * | 11/1999 | Saito | 326/30 |
| 6,046,653 A | 4/2000 | Yamada | |

(Continued)

FOREIGN PATENT DOCUMENTS

GB    2024525    1/1980

OTHER PUBLICATIONS

Notice of Grant mailed Aug. 9, 2008 for Great Britain Patent Application No. 0625616.8.

(Continued)

*Primary Examiner* — Sanh Phu
(74) *Attorney, Agent, or Firm* — Blakely, Sokoloff, Taylor & Zafman LLP

(57) ABSTRACT

For one disclosed embodiment, an integrated circuit may comprise an internal transmission line in one or more layers of the integrated circuit. The internal transmission line may be coupled to receive a signal from an external transmission line at a first end of the internal transmission line without use of termination circuitry. The internal transmission line may transmit the signal passively to a second end of the internal transmission line. The integrated circuit may also comprise first circuitry having an input coupled to the internal transmission line at a first location of the internal transmission line to receive the signal and second circuitry having an input coupled to the internal transmission line at a second location of the internal transmission line to receive the signal. The second location may be different from the first location. Other embodiments are also disclosed.

20 Claims, 14 Drawing Sheets

(56) References Cited

U.S. PATENT DOCUMENTS

| | | | |
|---|---|---|---|
| 6,087,847 | A | 7/2000 | Mooney et al. |
| 6,522,186 | B2 | 2/2003 | O'Mahony et al. |
| 6,529,037 | B1 | 3/2003 | Haycock et al. |
| 6,536,025 | B2 | 3/2003 | Kennedy et al. |
| 6,597,198 | B2 | 7/2003 | Haycock et al. |
| 6,639,423 | B2 | 10/2003 | Martin et al. |
| 6,791,356 | B2 | 9/2004 | Haycock et al. |
| 6,803,790 | B2 | 10/2004 | Haycock et al. |
| 6,909,127 | B2 | 6/2005 | O'Mahony et al. |
| 7,218,491 | B2 | 5/2007 | Jaussi et al. |
| 7,222,208 | B1 | 5/2007 | Haycock et al. |
| 7,275,004 | B2 | 9/2007 | Caspar et al. |
| 7,307,822 | B2 * | 12/2007 | Kitagawa et al. ............ 361/91.1 |
| 7,352,059 | B2 | 4/2008 | O'Mahony et al. |
| 7,474,718 | B2 * | 1/2009 | Liu ............................... 375/344 |
| 7,697,601 | B2 | 4/2010 | Mansuri et al. |
| 2004/0267469 | A1 | 12/2004 | Caspar et al. |
| 2005/0194992 | A1 | 9/2005 | Binder |
| 2006/0073792 | A1 * | 4/2006 | Schoning et al. ............... 455/83 |
| 2007/0001704 | A1 | 1/2007 | O'Mahony |

OTHER PUBLICATIONS

Notice of Allowance mailed Aug. 27, 2008 for Korean Patent Application No. 10-2006-136601.

Examination Report for United Kingdom Patent Application No. GB0625616.8 dated Jan. 8, 2008; 3 pages.

Combined Search and Examination Report for United Kingdom Patent Application No. GB0625616.8 dated Apr. 18, 2007, 7 pages.

Office Action received for Korean Patent Application No. 10-2006-0136601 dated Jan. 28, 2008; 5 pages.

State Intellectual Property Office, P.R. China, Office Action for corresponding Patent Application No. 200610130994.4, issued Apr. 3, 2009, 4 pages.

English Translation of State Intellectual Property Office, P.R. China Office Action for corresponding Patent Application No. 200610130994.4, issued Apr. 3, 2009. 6 pages.

State Intellectual Property Office, P.R. China, Office Action for corresponding Patent Application No. 200610130994.4, issued Feb. 12, 2010, 6 pages.

English Translation of State Intellectual Property Office, P.R. China, Office Action for corresponding Patent Application No. 200610130994.4, issued Feb. 12, 2010, 6 pages.

Non-Final Office Action mailed Nov. 18, 2009 for U.S. Appl. No. 11/323,370.

Non-Final Office Action mailed Jun. 10, 2009 for U.S. Appl. No. 11/323,370.

Final Office Action mailed Dec. 1, 2010 for U.S. Appl. No. 11/323,30.

Non-Final Office Action mailed Aug. 25, 2011 for U.S. Appl. No. 11/323,30.

Notice of Allowance mailed Mar. 16, 2012 for U.S. Appl. No. 11/323,30.

Balamurugan, G. , et al., "Modeling and Mitigation of Jitter in High-Speed Source-Sychronous Inter-Chip Communication Systems", Asilomar Conference on Signals, Systems, and Computers, pp. 1681-1687, Nov. 2003.

Caspar, B. , et al., "A 20-Gb/s Forwarded Clock Transceiver in 90nm CMOS", IEEE International Solid-State Circuits Conference, 10 pages. Feb. 6-9, 2006.

Caspar, B. , "An 8-Gb/s Simultaneous Bidirectional Link with on-Die Waveform Capture", IEEE Journal of Solid-State Circuits, vol. 38, No. 12, pp. 2111-2120. Dec. 2003.

Caspar, B. , et al., "An Accurate and Efficient Analysis Method for Multi-Gb/s Chip-to-Chip Signaling Schemes", IEEE Symposium on VLSI Circuits Digest of Technical Papers, pp. 54-57, 2002.

Chang, K. , et al., "Clocking and Circuit Design for a Parallel I/O on a First Generation CELL Processor", IEEE International Solid-State Circuits Conference, Slide Presentation, 29 pages. Feb. 2005.

Chang, K. et al., "Clocking and Circuit Design for a Parallel I/O on a First-Generation CELL Processor", IEEE International Solid-State Circuits Conference, pp. 526-527 and 615. Feb. 2005.

Dally, W. "Transmitter Equalization for 4-Gbps Signaling", IEEE Micro, pp. 48-56. Jan./Feb. 1997.

Freedman, A. "The Computer Desktop Encyclopedia", p. 437. 1996.

Jaussi, J. et al., "A 20Gb/s Embedded Clock Transceiver in 90nm CMOS", IEEE International Solid-State Circuits Conference, 10 pages. Feb. 6-9, 2006.

Kleveland, B. et al., "Distributed EDS Protection for High-Speed Integrated Circuits", IEEE Electron Device Letters, vol. 21, No. 8, pp. 390-392. Aug. 2000.

Lee, T. et al., "A 2.5 V CMOS Delay-Locked Loop for an 18 Mbit, 500 Megabyte/s DRAM", IEEE Journal of Solid-State Circuits, vol. 29, No. 12, pp. 1491-1496. Dec. 1994.

Martin, A. et al., "8Gb/s Differential Simultaneous Bidirectional Link with 4mV 9ps Waveform Capture Diagnostic Capability", IEEE International Solid-State Circuits Conference, 10 pages. Feb. 2003.

Maxim, A. et al., "A Multi-Rate 9.953-12.5GHz 0.2um SiGe BICMOS LC Oscillator with -120dBc/Hz Phase Noise at 1MHz Offset Using a Variable Resistor Based Varactor", IEEE Symposium on VLSI Circuits Digest of Technical Papers, pp. 22-205. Jun. 2005.

McNeill, J. "Jitter in Ring Oscillators", IEEE Journal of Solid-State Circuits, vol. 32, No. 6, pp. 870-879. Jun. 1997.

Mooney, R. et al., "A 900 Mb/s Bidirectional Signaling Scheme", IEEE Journal of Solid-State Circuits, vol. 30, No. 12, pp. 1538-1543. Dec. 1995.

O'Mahony, F. et al., "A Low-Jitter PLL and Repeaterless Clock Distribution Network for a 20Gb/s Link", IEEE Symposium on VLSI Circuits Digest of Technical Papers. 2 pages. 2006.

Stojanovic, V. et al., "Modeling and Analysis of High-Speed Links", IEEE Custom Integrated Circuits Conference, pp. 589-594. 2003.

Taylor, G. et al. "A 2MB, 3.6GB/s Back-Sid Bus Cache for an IA32 450 MHz Microprocessor", IEEE Symposium on VLSI Circuits Digest of Technical Papers. pp. 184-185. Jun. 1998.

Wilson, H. et al., "A Six-Port 30-GB/s Nonblocking Router Component Using Point-to-Point Simultaneous Bidirectional Signaling for High-Bandwidth Interconnects", IEEE Journal of Solid-State Circuits, vol. 36, No. 12. pp. 1954-1963. Dec. 2001.

Wong, K. et al., "A 27-mW 3.6Gb/s I/O Transceiver", IEEE Journal of Solid-State Circuits, vol. 39, No. 4. pp. 602-612 (Apr. 2004).

Wong, K. et al., "A 27-mW-Gb/s I/O Transceiver", IEEE Symposium on VLSI Circuits Digest of Technical Papers. pp. 99-102. Jun. 2003.

Wong, S. et al., "On-Chip Interconnect Inductance—Friend or Foe", IEEE International Symposium on Quality Electronic Design. 6 pages. Mar. 2003.

Yamaguchi, K. et al., "12Gb/s Duobinary Signaling with x2 Oversampled Edge Equalization", IEEE International Solid-State Circuits Conference. pp. 70-71. Feb. 2005.

Yang, C. et al., "A Serial-Link Transceiver Based on 8-GSamples/s A/D and D/A Converters in 0.25-um CMOS", IEEE Journal of Solid-State Circuits, vol. 36, No. 11. pp. 1684-1692. Nov. 2001.

Zerbe, J. et al., "Equalization and Clock Recovery for a 2.5-10-Gb/s 2-PAM/4-PAM Backplane Transceiver Cell", IEEE Journal of Solid-State Circuits, vol. 38, No. 12. pp. 2121-2130. Dec. 2003.

Non-Final Office Action for United Kingdom Patent Application No. 0625616.8 mailed Dec. 20, 2010, 9 pages.

Notice of Reexamination issued in Chinese Patent Application No. 200610130994.4, mailed May 14, 2013.

* cited by examiner

INTEGRATED CIRCUIT PASSIVE SIGNAL DISTRIBUTION

CLAIM OF PRIORITY

The present application is a Continuation of, and claims priority to and incorporates by reference in its entirety, the corresponding U.S. patent application Ser. No. 11/323,370 filed Dec. 29, 2005, and entitled "INTEGRATED CIRCUIT PASSIVE SIGNAL DISTRIBUTION," and issued as U.S. Pat. No. 8,213,894 on Jul. 3, 2012.

FIELD

Embodiments described herein generally relate to integrated circuits.

BACKGROUND

FIG. 1 illustrates a prior art clock signal distribution network 110 in an integrated circuit 101. Integrated circuit 101 is coupled to external transmission lines at respective pads, such as pad 112 for example, to receive clock and data signals from a transmitter 102 in a source synchronous (SS) system. Clock signals are received at pad 112 and recovered by a buffer 121 of integrated circuit 101. A termination resistor 118 is close to pad 112 to inhibit signal reflections at or near pad 112 as clock signals are received by integrated circuit 101. Such signal reflections may degrade signal integrity.

The recovered clock signals are distributed through wires to receivers 131, 132, 133, and 134 where they are either used directly by receiver 131, 132, 133, and/or 134 or input to a clock loop, such as a delay-locked loop (DLL), phase-locked loop (PLL), multiplying DLL, or frequency-locked loop (FLL), of receiver 131, 132, 133, and/or 134. Receiver 131, 132, 133, and/or 134 may use received clock signals, for example, to recover data signals transmitted by transmitter 102.

The distribution wires tend to be treated as dispersive resistance-capacitance (RC) wires, and buffers 122, 123, and 124 are inserted to sharpen the edges of the clock signals. Buffers 121, 122, 123, and 124 are sized to drive the total capacitance of any subsequent buffers and/or receivers. Power supply noise at buffers 121, 122, 123, and 124 changes the buffer delay and introduces timing jitter into a passed clock signal. Such jitter is generally proportional to the number of buffer(s) that have passed the clock signal. Clock timing jitter can reduce both timing and voltage margins within data links, resulting in reduced link performance or reduced maximum achievable data rate. Clock timing jitter may also require additional power to compensate for degraded signal-to-noise ratio.

Also, capacitance at pad 112 can cause a discontinuity at pad 112, resulting in reflection of some signal power back onto the external transmission line coupled to pad 112. Such reflections can attenuate or distort the clock signals and therefore can limit link performance and/or require additional power. The capacitance at pad 112 is the sum of capacitive loads near pad 112, including pad 112 itself, wiring, buffers 121, 122, 123, and 124, and receivers 131, 132, 133, and 134.

FIG. 2 illustrates a prior art data signal distribution network 210 in an integrated circuit 201. Integrated circuit 201 is coupled to external transmission lines at respective pads, such as pad 212 for example, to receive data signals from a transmitter 202. Multiple data receivers 231, 232, 233, and 234 are coupled to the same pad 212, for example, to de-multiplex data or to use separate receivers for data and clock recovery. A termination resistor 218 is close to pad 212 to inhibit signal reflections at or near pad 212 as data signals are received by integrated circuit 201. Such signal reflections may degrade signal integrity.

Similarly as with pad 112 of FIG. 1, capacitance at pad 212 can cause a discontinuity at pad 212, resulting in reflection of some signal power back onto the external transmission line coupled to pad 212. Such reflections can cause inter-symbol interference (ISI) which can limit link performance and/or require additional power. The capacitance at pad 212 is the sum of capacitive loads near pad 212, including pad 212 itself, wiring, and receivers 231, 232, 233, and 234.

BRIEF DESCRIPTION OF THE DRAWINGS

Embodiments are illustrated by way of example and not limitation in the figures of the accompanying drawings, in which like references indicate similar elements and in which.

The figures of the drawings are not necessarily drawn to scale.

DETAILED DESCRIPTION

The following detailed description sets forth example embodiments of apparatuses, methods, and systems relating to integrated circuit passive signal distribution. Features, such as structure(s), function(s), and/or characteristic(s) for example, are described with reference to one embodiment as a matter of convenience; various embodiments may be implemented with any suitable one or more described features.

Passive Distribution of Externally Generated Signal

Figure 3:
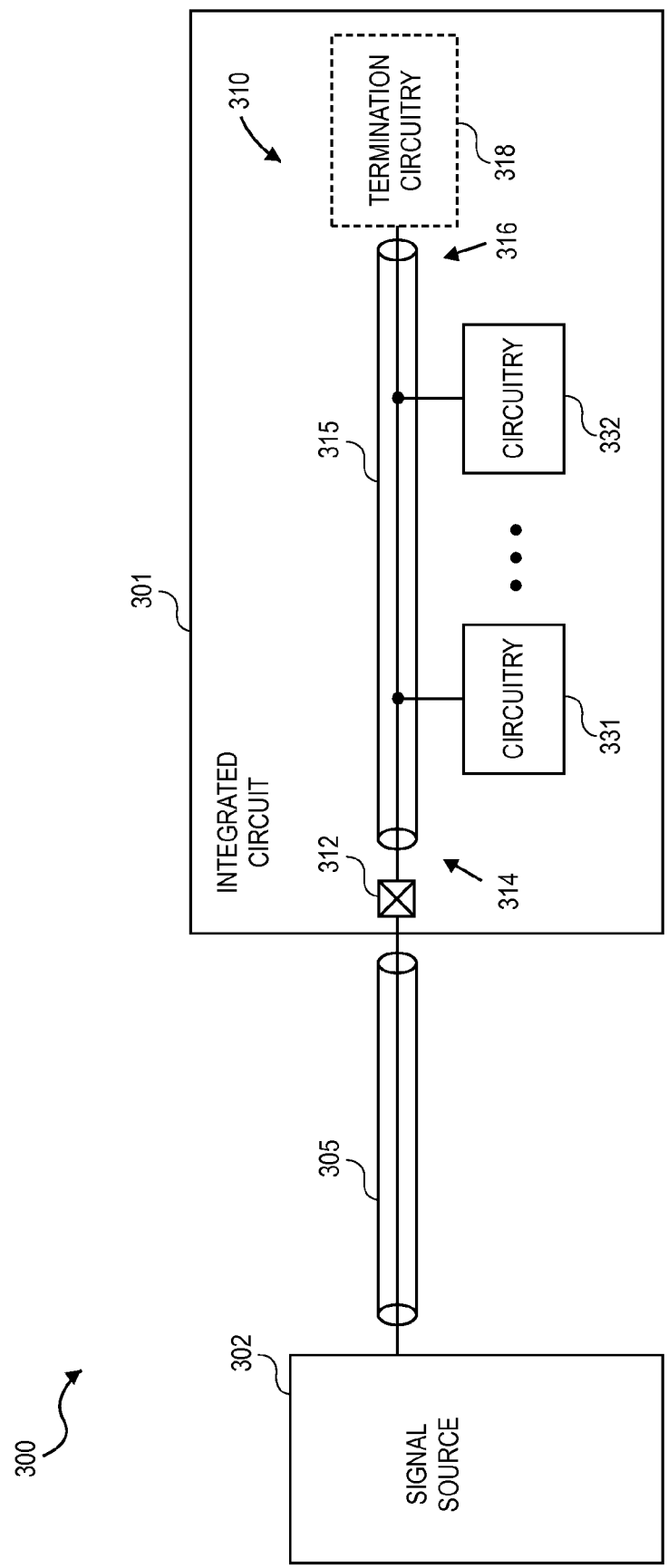
FIG. 3 illustrates, for one embodiment, a passive signal distribution network to receive and distribute an externally generated signal in an integrated circuit.

FIG. 3 illustrates, for one embodiment, a passive signal distribution network 310 to receive and distribute an externally generated signal in an integrated circuit 301. Integrated circuit 301 may be coupled to receive a signal from a signal source 302. Signal source 302 may comprise any suitable circuitry to transmit any suitable signal over an external transmission line 305 to integrated circuit 301 at any suitable speed. Signal source 302 for one embodiment may transmit a clock signal over external transmission line 305 to integrated circuit 301. Signal source 302 for one embodiment may transmit a data signal over external transmission line 305 to integrated circuit 301. Signal source 302 for one embodiment may transmit a signal over external transmission line 305 to integrated circuit 301 at a relatively high speed, such as at a frequency over 1 Gigahertz (GHz), at a frequency over 5 GHz, or at a frequency over 10 GHz for example. Signal source 302 and integrated circuit 301 for one embodiment may form at least a portion of a system 300.

Integrated circuit 301 may be coupled to external transmission line 305 at an input node 312 to receive a signal from signal source 302. Input node 312 for one embodiment, as illustrated in FIG. 3, may be implemented as a pad. Input node 312 for another embodiment may be implemented in an alternative manner. Although described and illustrated as receiving a signal over one external transmission line 305 for one embodiment, integrated circuit 301 for one embodiment may comprise suitable circuitry to receive any suitable signal over one or more additional external transmission lines. Such circuitry may or may not be similar to that for passive signal distribution network 310.

Integrated circuit 301 for one embodiment, as illustrated in FIG. 3, may comprise an internal transmission line 315 in one or more layers of integrated circuit 301. Internal transmission line 315 extends from an end 314 to another end 316. Internal transmission line 315 for one embodiment may be coupled to receive a signal from external transmission line 305 at end 314 of internal transmission line 315 to transmit the signal passively to end 316 of internal transmission line 315. For one embodiment, end 314 may be coupled to input node 312. End 314 for one embodiment may be directly connected to input node 312.

Internal transmission line 315 for one embodiment may be conductive wiring that extends from end 314 to end 316. Such conductive wiring for one embodiment may be wholly formed in one or more layers of integrated circuit 301. For one embodiment, such conductive wiring may be directly connected to input node 312.

Integrated circuit 301 may comprise circuitry, such as circuitry 331 and 332 for example, having respective inputs coupled to internal transmission line 315 at different respective locations of internal transmission line 315 to receive a signal passively transmitted on internal transmission line 315. Integrated circuit 301 may comprise circuitry having a respective input coupled to internal transmission line 315 at end 314, at any suitable location between end 314 and end 316, and/or at end 316. Circuitry 331, for example, may have an input coupled to internal transmission line 315 at end 314 or between end 314 and end 316 to receive a signal passively transmitted on internal transmission line 315. Circuitry 332, for example, may have an input coupled to internal transmission line 315 between end 314 and end 316 or at end 316 to receive a signal passively transmitted on internal transmission line 315. Although illustrated with circuitry 331 and 332 for one embodiment, integrated circuit 301 for one embodiment may comprise circuitry having respective inputs coupled to internal transmission line 315 at any suitable number of three or more different respective locations.

Any suitable circuitry may have an input coupled to internal transmission line 315 to receive a signal passively transmitted on internal transmission line 315. Such circuitry may recover the received signal passively transmitted on internal transmission line 315 for any suitable purpose.

For one embodiment, internal transmission line 315 may be designed to receive a signal from external transmission line 305 with reduced or minimized signal reflection as a signal passes from external transmission line 305 to internal transmission line. Internal transmission line 315 for one embodiment may be designed to therefore receive a signal from external transmission line 305 without use of termination circuitry to inhibit any such signal reflection. In this manner, internal transmission line 315 for one embodiment may effectively extend external transmission line 305 into integrated circuit 301. Internal transmission line 315 for one embodiment may be designed to receive a signal from external transmission line 305 without use of termination circuitry either external to integrated circuit 301 or as part of integrated circuit 301 to inhibit any such signal reflection. Internal transmission line 315 for one embodiment may be designed to receive a signal from external transmission line 305 without use of termination circuitry at or near input node 312.

Internal transmission line 315 for one embodiment may have an impedance relative to an impedance of external transmission line 305 to inhibit signal reflection as a signal passes from external transmission line 305 to internal transmission line 315. Internal transmission line 315 for one embodiment may have an impedance approximately equal to the characteristic impedance of external transmission line 305.

Integrated circuit 301 for one embodiment may optionally comprise termination circuitry 318 to inhibit signal reflection from end 316 of internal transmission line 315. Using termination circuitry 318 for one embodiment may help reduce or minimize apparent capacitance at a pad for input node 312. Termination circuitry 318 for one embodiment may have an impedance relative to an impedance of internal transmission line 315 to inhibit signal reflection from end 316 of internal transmission line 315. Termination circuitry 318 for one embodiment may have an impedance approximately equal to the characteristic impedance of internal transmission line 315.

Termination circuitry 318 for one embodiment may be coupled to internal transmission line 315 at any suitable location at or near end 316. Termination circuitry 318 may comprise any suitable circuitry. Termination circuitry 318 for one embodiment may comprise a resistor of any suitable resistance coupled between internal transmission line 315 and a supply node, such as ground for example. Termination circuitry 318 may implement such a resistor in any suitable manner.

Integrated circuit 301 for one embodiment may not comprise termination circuitry to inhibit any signal reflection from end 316 of internal transmission line 315. For one embodiment, external transmission line 305 and internal transmission line 315 may have a combined length less than a wavelength of a signal transmitted over external transmission line 305 and internal transmission line 315. For one embodiment, external transmission line 305 and internal transmission line 315 may have a combined length that may be small relative to a wavelength of a signal transmitted over external transmission line 305 and internal transmission line 315. For one embodiment, integrated circuit 301 and an integrated circuit for signal source 302 may be stacked to use a relatively short external transmission line 305.

Integrated circuit 301 for one embodiment may not comprise or use any active devices to help transmit a signal received from external transmission line 305 onto internal transmission line 315. Integrated circuit 301 for one embodiment may not comprise or use any active devices along internal transmission line 315 to help transmit a signal received from external transmission line 305 further along internal transmission line 315. Integrated circuit 301 for one embodiment may not comprise or use any active devices to help transmit a signal received from external transmission line 305 either onto or along internal transmission line 315.

Figure 1:
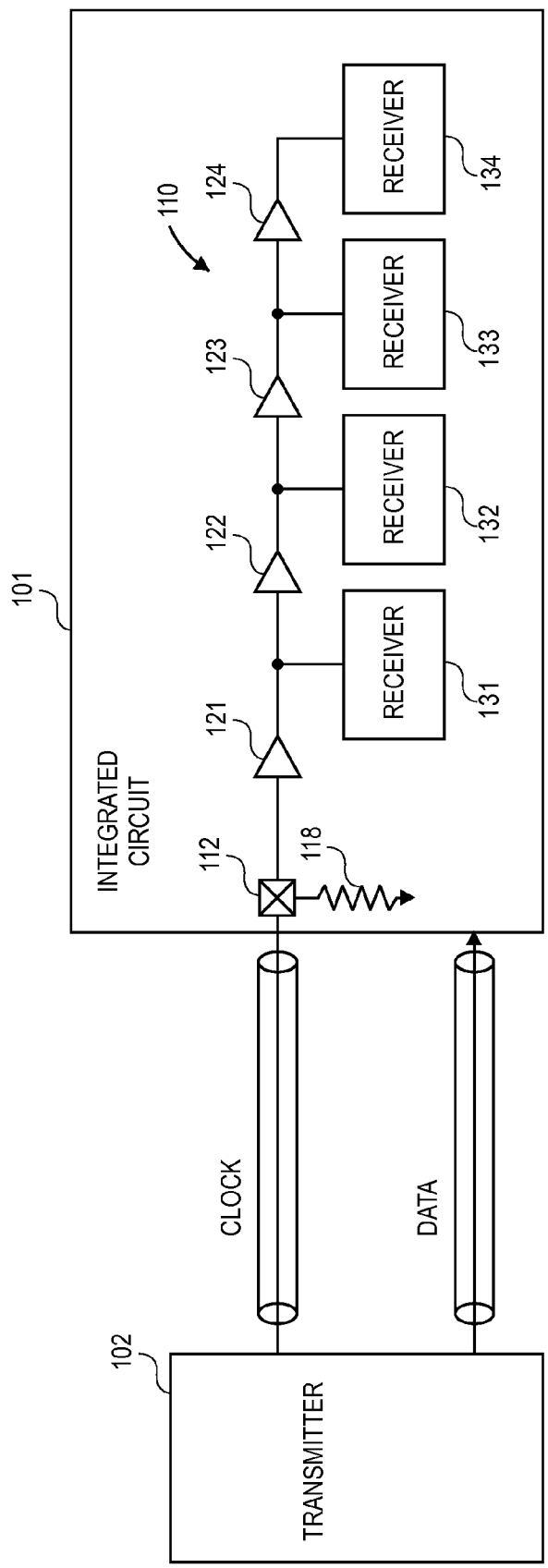
FIG. 1 illustrates a prior art clock signal distribution network in an integrated circuit.

Instead of using active device(s), such as a buffer for example, passive signal distribution network 310 for one embodiment may distribute a signal received from external transmission line 305 using power from the signal itself. Not using active device(s), such as a buffer for example, for one embodiment may help reduce or avoid introducing timing jitter into a signal transmitted on internal transmission line 315 and therefore help improve link performance and/or reduce power consumption. Not using active device(s) for one embodiment may help improve link performance and/or reduce power consumption relative, for example, to prior art clock signal distribution network 110 of FIG. 1.

Figure 2:
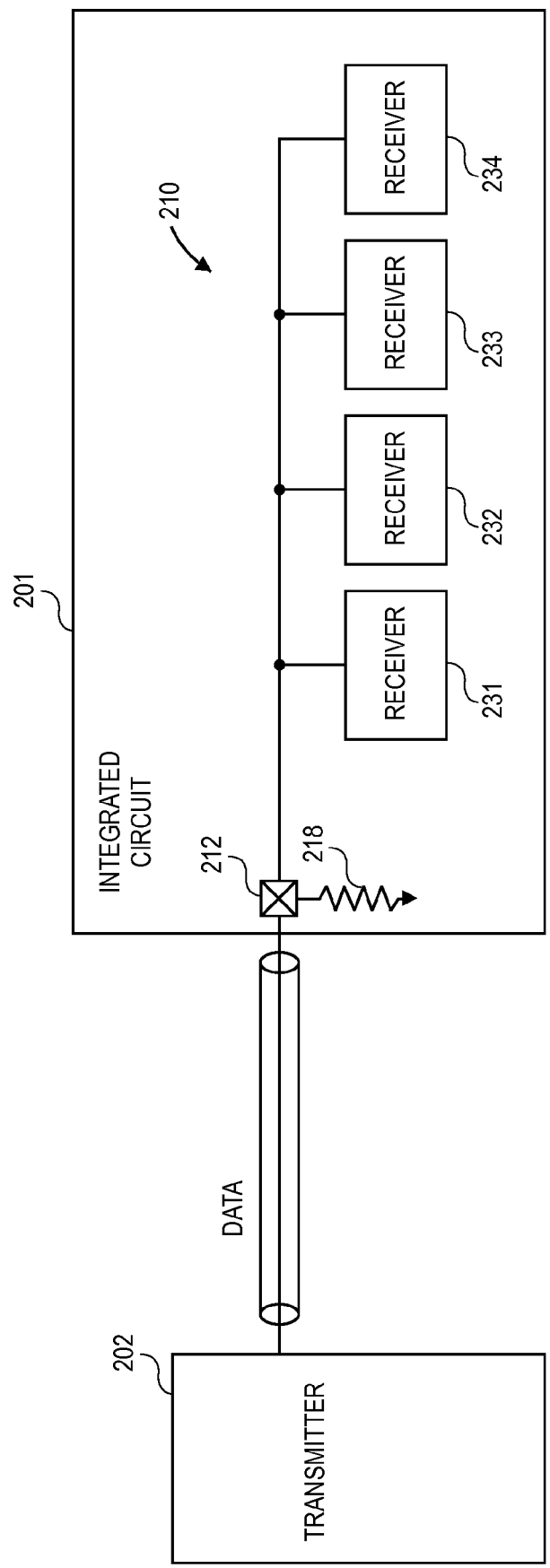
FIG. 2 illustrates a prior art data signal distribution network in an integrated circuit.

Circuitry, such as circuitry 331 and 332 for example, coupled to internal transmission line 315 for one embodiment may have one or more active device(s), such as a buffer for example, to convert a signal received from internal transmission line 315 to a suitable level for use by such circuitry. For one embodiment where circuitry may be coupled to internal transmission line 315 at locations spaced by a small distance relative to a wavelength of a signal transmitted along internal transmission line 315, capacitance of such active devices can be treated as being absorbed into the distributed capacitance of internal transmission line 315. Passive signal distribution network 310 for one embodiment may therefore help reduce apparent capacitance at a pad for input node 312, helping to improve link performance and/or reduce power consumption. Passive signal distribution network 310 for one embodiment may help improve link performance and/or reduce power consumption relative, for example, to prior art clock signal distribution network 110 of FIG. 1 and prior art data signal distribution network 210 of FIG. 2. Internal transmission line 315 for one embodiment may be designed with an inductance to account for the distributed capacitance to achieve a desired impedance of internal transmission line 315.

Integrated circuit 301 for one embodiment may not comprise or use any passive devices in transmitting a signal received from external transmission line 305 onto internal transmission line 315. Integrated circuit 301 for one embodiment may not comprise or use any passive devices along internal transmission line 315 in transmitting a signal received from external transmission line 305 along internal transmission line 315. Integrated circuit 301 for one embodiment may not comprise or use any passive devices in transmitting a signal received from external transmission line 305 either onto or along internal transmission line 315.

Integrated circuit 301 for one embodiment may not comprise or use, for example, any shunt capacitors along internal transmission line 315. Integrated circuit 301 for one embodiment may not comprise or use, for example, any series inductors along internal transmission line 315.

Integrated circuit 301 for one embodiment may comprise one or more passive devices to use in transmitting a signal received from external transmission line 305 onto internal transmission line 315. Integrated circuit 301 for one embodiment may comprise one or more passive devices along internal transmission line 315 to use in transmitting a signal received from external transmission line 305 along internal transmission line 315. Integrated circuit 301 for one embodiment may comprise passive devices to use in transmitting a signal received from external transmission line 305 both onto and along internal transmission line 315. Integrated circuit 301 for one embodiment may comprise one or more passive devices wholly formed in integrated circuit 301 to use in transmitting a signal received from external transmission line 305 onto and/or along internal transmission line 315.

Integrated circuit 301 for one embodiment may comprise, for example, a suitable matching network at or near input node 312 to help compensate for any signal loss on internal transmission line 315. Such a matching network for one embodiment may help allow internal transmission line 315 to be designed relatively more freely. Such a matching network for one embodiment may be implemented, for example, using an inductor shunted to ground. Such a matching network for one embodiment may include a pad for input node 312 to help further reduce capacitance.

Integrated circuit 301 for one embodiment may comprise, for example, a series capacitor at or near input node 312 to help AC couple a signal from external transmission line 305 onto internal transmission line 315. Such a capacitor for one embodiment may effectively serve as a high pass filter.

Integrated circuit 301 for one embodiment may comprise, for example, one or more shunt capacitors and/or one or more series inductors along internal transmission line 315.

Figure 4:
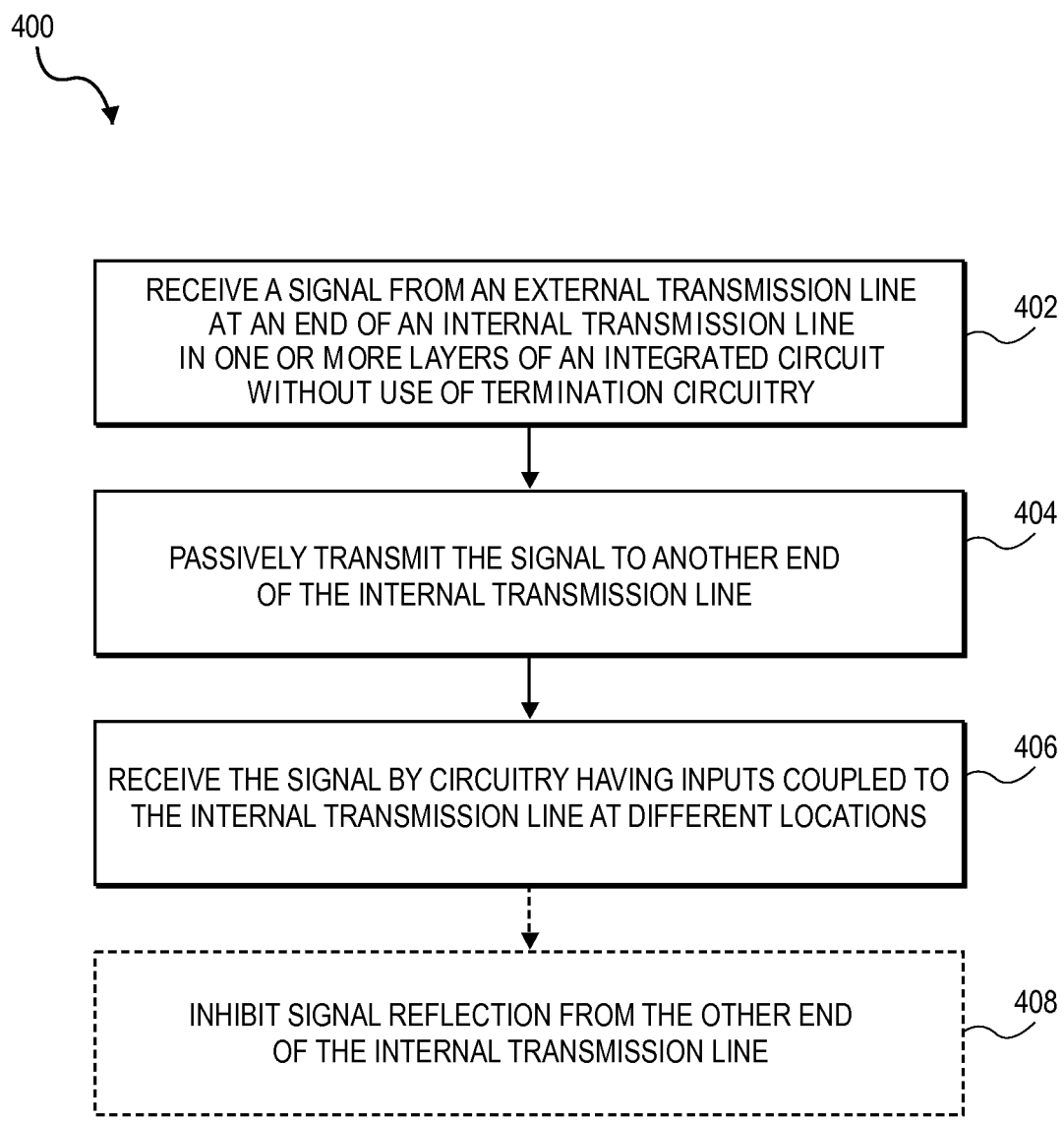
FIG. 4 illustrates, for one embodiment, a flow diagram to receive and passively distribute an externally generated signal in an integrated circuit.

FIG. 4 illustrates, for one embodiment, a flow diagram 400 to receive and passively distribute an externally generated signal in integrated circuit 301. For block 402 of FIG. 4, a signal may be received from external transmission line 305 at end 314 of internal transmission line 315 without use of termination circuitry. The signal for one embodiment may be a clock signal. The signal for one embodiment may be a data signal. The signal may be passively transmitted for block 404 to end 316 of internal transmission line 315. For block 406, the signal may be received by circuitry 331 and 332, for example. Signal reflection from end 316 may optionally be inhibited for block 408 using termination circuitry 318.

Active Distribution of Externally Generated Signal

Integrated circuit 301 for an alternative embodiment may comprise one or more active devices along internal transmission line 315 to use in transmitting a signal received from external transmission line 305 along internal transmission line 315. Integrated circuit 301 for one embodiment may comprise one or more active devices wholly formed in integrated circuit 301 to use in transmitting a signal received from external transmission line 305 along internal transmission line 315.

Integrated circuit 301 for one embodiment may comprise, for example, one or more active shunt devices along internal transmission line 315 to help compensate for any signal loss on internal transmission line 315. An active shunt device for one embodiment may help sharpen an edge of a passed signal and may introduce less jitter from power supply noise into the passed signal relative to a series buffer, for example. Integrated circuit 301 for one embodiment may comprise, for example, one or more shunt amplifiers, such as a trans-conductance amplifier for example, along internal transmission line 315. Integrated circuit 301 for one embodiment may comprise, for example, one or more shunt diodes along internal transmission line 315.

Passive Distribution of Internally Generated Signal

Figure 5:
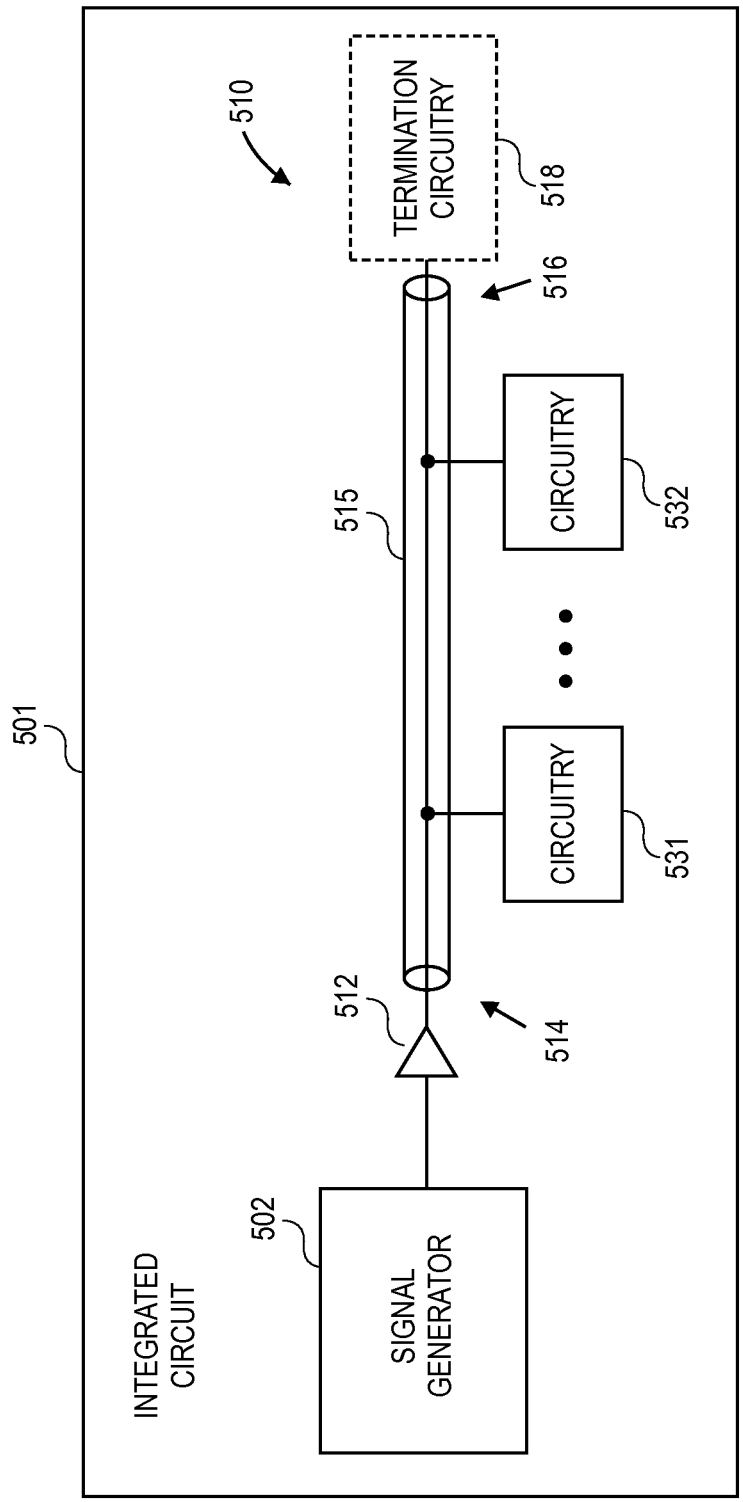
FIG. 5 illustrates, for one embodiment, a passive signal distribution network to distribute an internally generated signal in an integrated circuit.

FIG. 5 illustrates, for one embodiment, a passive signal distribution network 510 to distribute an internally generated signal in an integrated circuit 501. Integrated circuit 501 may comprise a signal generator 502 to generate a signal. Signal generator 502 may comprise any suitable circuitry to generate any suitable signal at any suitable speed. Signal generator 502 for one embodiment may generate a clock signal. Signal generator 502 for one embodiment may generate a data signal. Signal generator 502 for one embodiment may generate a signal at a relatively high speed, such as at a frequency over 1 Gigahertz (GHz), at a frequency over 5 GHz, or at a frequency over 10 GHz for example. Although described and illustrated as distributing a signal generated from one signal generator 502 for one embodiment, integrated circuit 501 for one embodiment may comprise suitable circuitry to distribute any suitable signal from one or more additional signal generators. Such circuitry may or may not be similar to that for passive signal distribution network 510.

Integrated circuit 501 for one embodiment, as illustrated in FIG. 5, may comprise an internal transmission line 515 in one or more layers of integrated circuit 501. Internal transmission line 515 extends from an end 514 to another end 516. Internal transmission line 515 for one embodiment may be coupled to receive a signal from signal generator 502 at end 514 of internal transmission line 515 to transmit the signal passively to end 516 of internal transmission line 515.

Internal transmission line 515 for one embodiment may be conductive wiring that extends from end 514 to end 516. Such conductive wiring for one embodiment may be wholly formed in one or more layers of integrated circuit 501.

Integrated circuit 501 for one embodiment may comprise a buffer 512 to drive a signal generated by signal generator 502 to internal transmission line 515. Buffer 512 may have an input coupled to receive a signal generated by signal generator 502 and an output coupled to drive the received signal to internal transmission line 515.

Integrated circuit 501 may comprise circuitry, such as circuitry 531 and 532 for example, having respective inputs coupled to internal transmission line 515 at different respective locations of internal transmission line 515 to receive a signal passively transmitted on internal transmission line 515. Integrated circuit 501 may comprise circuitry having a respective input coupled to internal transmission line 515 at end 514, at any suitable location between end 514 and end 516, and/or at end 516. Circuitry 531, for example, may have an input coupled to internal transmission line 515 at end 514 or between end 514 and end 516 to receive a signal passively transmitted on internal transmission line 515. Circuitry 532, for example, may have an input coupled to internal transmission line 515 between end 514 and end 516 or at end 516 to receive a signal passively transmitted on internal transmission line 515. Although illustrated with circuitry 531 and 532 for one embodiment, integrated circuit 501 for one embodiment may comprise circuitry having respective inputs coupled to internal transmission line 515 at any suitable number of three or more different respective locations.

Any suitable circuitry may have an input coupled to internal transmission line 515 to receive a signal passively transmitted on internal transmission line 515. Such circuitry may recover the received signal passively transmitted on internal transmission line 515 for any suitable purpose.

Integrated circuit 501 for one embodiment may optionally comprise termination circuitry 518 to inhibit signal reflection from end 516 of internal transmission line 515. Using termination circuitry 518 for one embodiment may help reduce or minimize apparent capacitance at buffer 512. Termination circuitry 518 for one embodiment may have an impedance relative to an impedance of internal transmission line 515 to inhibit signal reflection from end 516 of internal transmission line 515. Termination circuitry 518 for one embodiment may have an impedance approximately equal to the characteristic impedance of internal transmission line 515.

Termination circuitry 518 for one embodiment may be coupled to internal transmission line 515 at any suitable location at or near end 516. Termination circuitry 518 may comprise any suitable circuitry. Termination circuitry 518 for one embodiment may comprise a resistor of any suitable resistance coupled between internal transmission line 515 and a supply node, such as ground for example. Termination circuitry 518 may implement such a resistor in any suitable manner.

Integrated circuit 501 for one embodiment may not comprise termination circuitry to inhibit any signal reflection from end 516 of internal transmission line 515. For one embodiment, internal transmission line 515 may have a length less than a wavelength of a signal transmitted over internal transmission line 515. For one embodiment, internal transmission line 515 may have a length that may be small relative to a wavelength of a signal transmitted over internal transmission line 515.

Integrated circuit 501 for one embodiment may not comprise or use any active devices along internal transmission line 515 to help transmit a signal received from signal generator 502 further along internal transmission line 515. Instead of using active device(s), such as a buffer for example, passive signal distribution network 510 for one embodiment may distribute a signal received from signal generator 502 using power from the signal itself. Not using active device(s), such as a buffer for example, for one embodiment may help reduce or avoid introducing timing jitter into a signal transmitted on internal transmission line 515 and therefore help improve link performance and/or reduce power consumption. Not using active device(s) for one embodiment may help improve link performance and/or reduce power consumption relative, for example, to prior art clock signal distribution network 110 of FIG. 1.

Circuitry, such as circuitry 531 and 532 for example, coupled to internal transmission line 515 for one embodiment may have one or more active device(s), such as a buffer for example, to convert a signal received from internal transmission line 515 to a suitable level for use by such circuitry. For one embodiment where circuitry may be coupled to internal transmission line 515 at locations spaced by a small distance relative to a wavelength of a signal transmitted along internal transmission line 515, capacitance of such active devices can be treated as being absorbed into the distributed capacitance of internal transmission line 515. Internal transmission line 515 for one embodiment may be designed to account for the distributed capacitance to achieve a desired impedance of internal transmission line 515.

Integrated circuit 501 for one embodiment may not comprise or use any passive devices in transmitting a signal from signal generator 502 onto internal transmission line 515. Integrated circuit 501 for one embodiment may not comprise or use any passive devices along internal transmission line 515 in transmitting a signal received from signal generator 502 along internal transmission line 515. Integrated circuit 501 for one embodiment may not comprise or use any passive devices in transmitting a signal from signal generator 502 either onto or along internal transmission line 515.

Integrated circuit 301 for one embodiment may not comprise or use, for example, any shunt capacitors along internal transmission line 515. Integrated circuit 301 for one embodiment may not comprise or use, for example, any series inductors along internal transmission line 515.

Integrated circuit 501 for one embodiment may comprise one or more passive devices to use in transmitting a signal from signal generator 502 onto internal transmission line 515. Integrated circuit 501 for one embodiment may comprise one or more passive devices along internal transmission line 515 to use in transmitting a signal received from signal generator 502 along internal transmission line 515. Integrated circuit 501 for one embodiment may comprise passive devices to use in transmitting a signal from signal generator 502 both onto and along internal transmission line 515. Integrated circuit 501 for one embodiment may comprise one or more passive devices wholly formed in integrated circuit 501 to use in transmitting a signal from signal generator 502 onto and/or along internal transmission line 515.

Integrated circuit 501 for one embodiment may comprise, for example, a series capacitor at or near end 514 to help AC couple a signal from buffer 512 onto internal transmission line 515. Such a capacitor for one embodiment may effectively serve as a high pass filter.

Integrated circuit 501 for one embodiment may comprise, for example, one or more shunt capacitors and/or one or more series inductors along internal transmission line 515.

Figure 6:
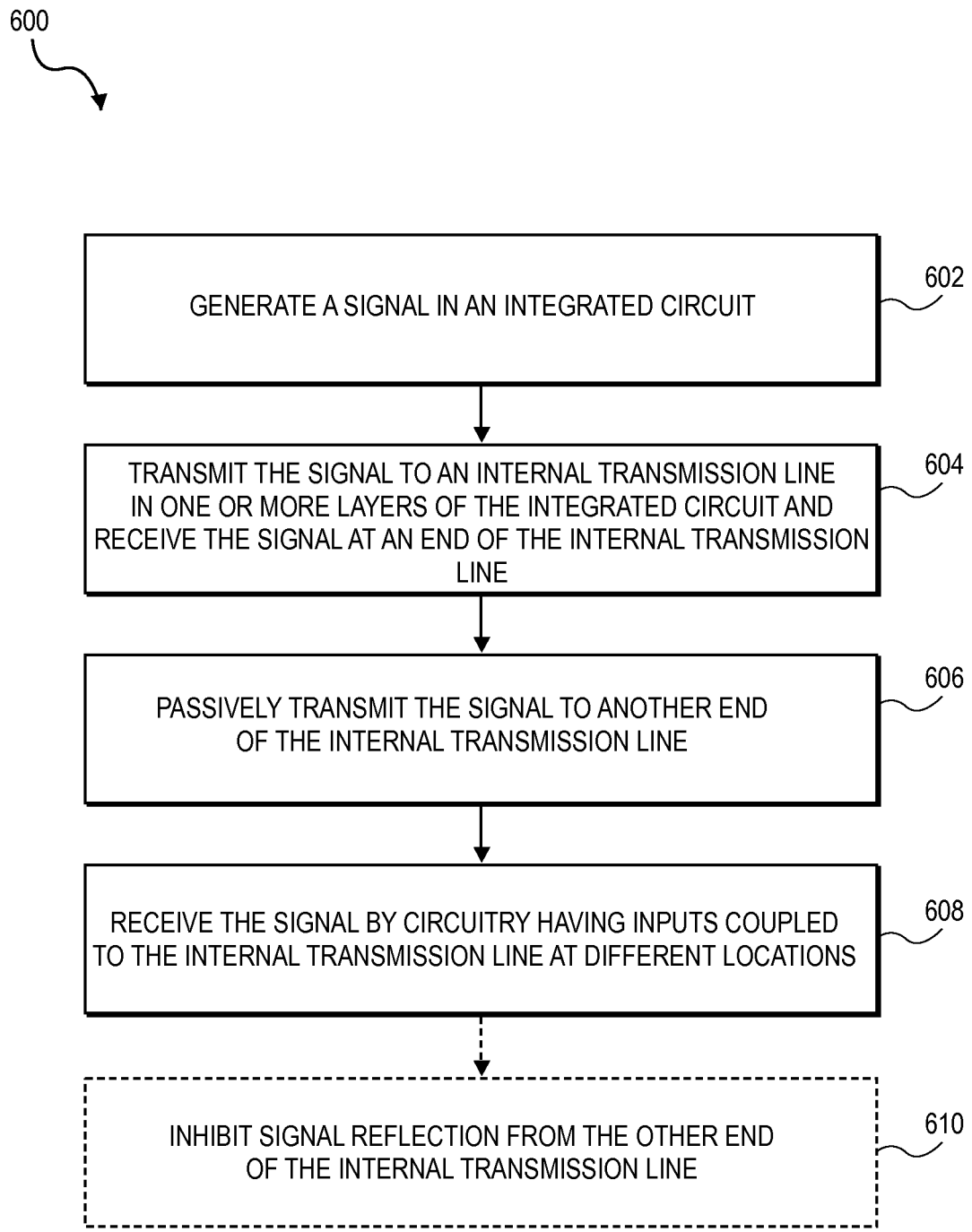
FIG. 6 illustrates, for one embodiment, a flow diagram to passively distribute an internally generated signal in an integrated circuit.

FIG. 6 illustrates, for one embodiment, a flow diagram 600 to passively distribute an internally generated signal in integrated circuit 501. For block 602 of FIG. 6, a signal may be generated in integrated circuit 501 by signal generator 502. The signal for one embodiment may be a clock signal. The signal for one embodiment may be a data signal. For block 604, the generated signal may be transmitted to internal transmission line 515 and received at end 514 of internal transmission line 515. The signal may be passively transmitted for block 606 to end 516 of internal transmission line 515. For block 608, the signal may be received by circuitry 531 and 532, for example. Signal reflection from end 516 may optionally be inhibited for block 610 using termination circuitry 518.

Active Distribution of Internally Generated Signal

Integrated circuit 501 for an alternative embodiment may comprise one or more active devices along internal transmission line 515 to use in transmitting a signal received from signal generator 502 along internal transmission line 515. Integrated circuit 501 for one embodiment may comprise one or more active devices wholly formed in integrated circuit 501 to use in transmitting a signal from signal generator 502 along internal transmission line 515.

Integrated circuit 501 for one embodiment may comprise, for example, one or more active shunt devices along internal transmission line 515 to help compensate for any signal loss on internal transmission line 515. An active shunt device for one embodiment may help sharpen an edge of a passed signal and may introduce less jitter from power supply noise into the passed signal relative to a series buffer, for example. Integrated circuit 501 for one embodiment may comprise, for example, one or more shunt amplifiers, such as a trans-conductance amplifier for example, along internal transmission line 515. Integrated circuit 501 for one embodiment may comprise, for example, one or more shunt diodes along internal transmission line 515.

Passive Distribution of Clock Signal

Figure 7:
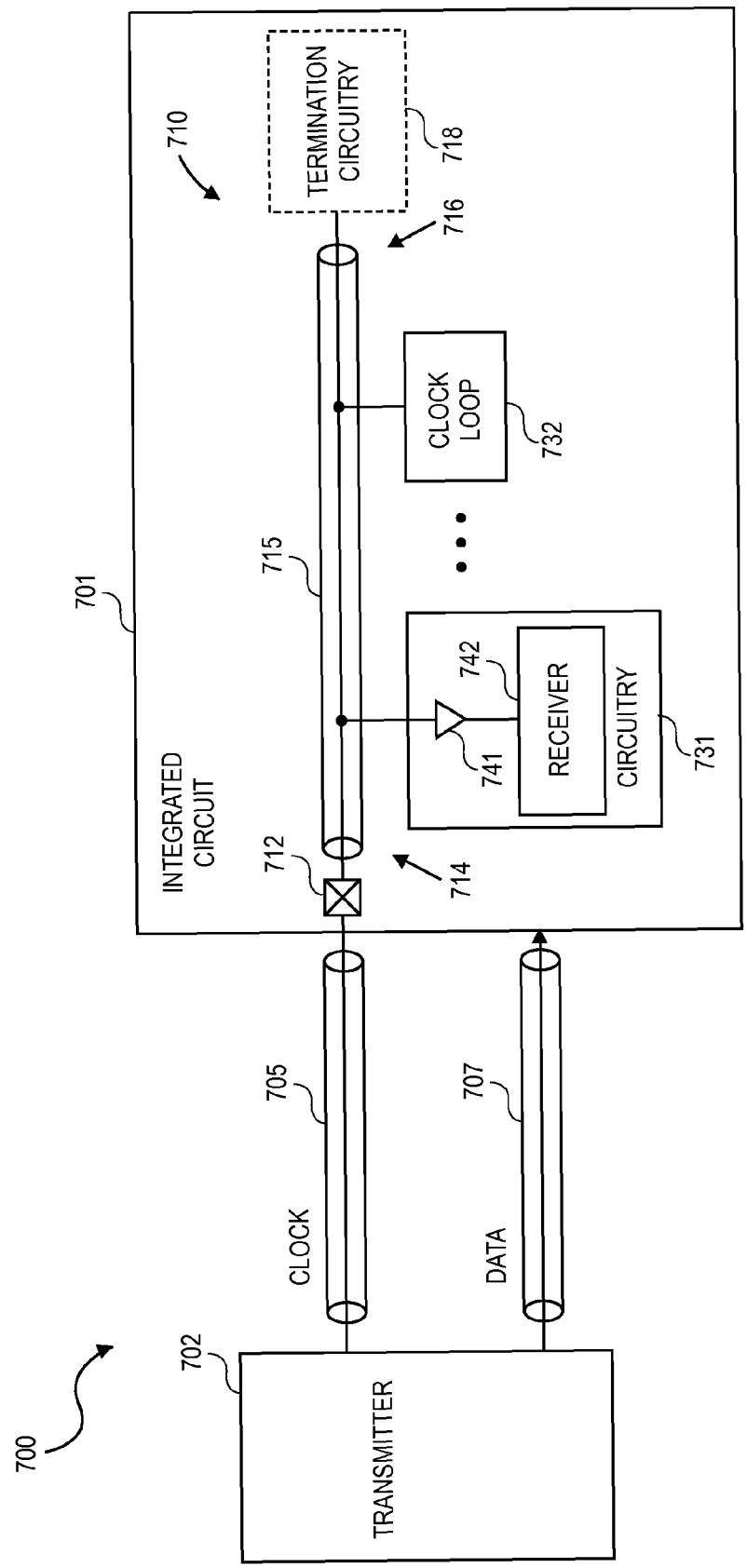
FIG. 7 illustrates, for one embodiment, a passive signal distribution network to receive and distribute in an integrated circuit a clock signal transmitted by a transmitter.

FIG. 7 illustrates, for one embodiment, a passive signal distribution network 710 to receive a clock signal transmitted by a transmitter 702 over an external transmission line 705 and distribute the received clock signal in an integrated circuit 701. Transmitter 702 for one embodiment may transmit a clock signal to integrated circuit 701 to implement source synchronous timing. Transmitter 702 and integrated circuit 701 for one embodiment may form at least a portion of a system 700.

Integrated circuit 701 may be coupled to external transmission line 705 at an input node 712 to receive a clock signal from transmitter 702. Integrated circuit 701 for one embodiment may comprise an internal transmission line 715 in one or more layers of integrated circuit 701. Internal transmission line 715 extends from an end 714 to another end 716. Internal transmission line 715 for one embodiment may receive a clock signal from external transmission line 705 without use of termination circuitry. Integrated circuit 701 may comprise circuitry having respective inputs coupled to internal transmission line 715 at different respective locations of internal transmission line 715 to receive a clock signal passively transmitted on internal transmission line 715. Integrated circuit 701 for one embodiment may optionally comprise termination circuitry 718 to inhibit signal reflection from end 716 of internal transmission line 715.

Components of system 700 of FIG. 7 generally correspond to those of system 300 of FIG. 3. The description relating to system 300 may generally apply to system 700 to the extent the description of system 300 is not inconsistent with the description of system 700.

Circuitry coupled to receive a clock signal from internal transmission line 715 for one embodiment may comprise a buffer to convert the received clock signal to a suitable level for use by such circuitry. As one example, circuitry 731 for one embodiment, as illustrated in FIG. 7, may comprise a buffer 741 coupled to receive a clock signal from internal transmission line 715 to convert the received clock signal to a suitable level for use by a receiver 742. Receiver 742 for one embodiment may be coupled to receive a clock signal from buffer 741 to help recover a data signal transmitted by transmitter 702 over another external transmission line 707. Although described and illustrated as having one receiver 742 to help recover a data signal from one external transmission line 707 for one embodiment, integrated circuit 701 for one embodiment may comprise one or more additional receivers to help recover a data signal from external transmission line 707 and/or may comprise suitable circuitry to receive any suitable signal over one or more additional external transmission lines. Such circuitry may or may not be similar to that for circuitry 731.

Circuitry coupled to receive a clock signal from internal transmission line 715 for one embodiment may comprise a clock loop, such as a clock loop 732 for example. Clock loop 732 may comprise, for example, a delay-locked loop (DLL), a phase-locked loop (PLL), a multiplying DLL, or a frequency-locked loop (FLL). Clock loop 732 for one embodiment may comprise a buffer coupled to receive a clock signal from internal transmission line 715 to convert the received clock signal to a suitable level for use by clock loop 732. Although described and illustrated as having one clock loop 732, integrated circuit 701 for one embodiment may comprise one or more additional clock loops coupled to receive a clock signal from internal transmission line 715. Such a clock loop may or may not be similar to clock loop 732.

Circuitry coupled to receive a clock signal from internal transmission line 715 for one embodiment may comprise both a buffer to convert the received clock signal to a suitable level for use by such circuitry and a clock loop. Such a buffer and clock loop for one embodiment may have a common input to receive a clock signal from internal transmission line 715.

Circuitry coupled to receive a clock signal from internal transmission line 715 for one embodiment may comprise one or more injection locked oscillators. Such an injection locked oscillator for one embodiment may comprise a buffer coupled to receive a clock signal from internal transmission line 715 to convert the received clock signal to a suitable level for use by the injection locked oscillator.

Figure 8:
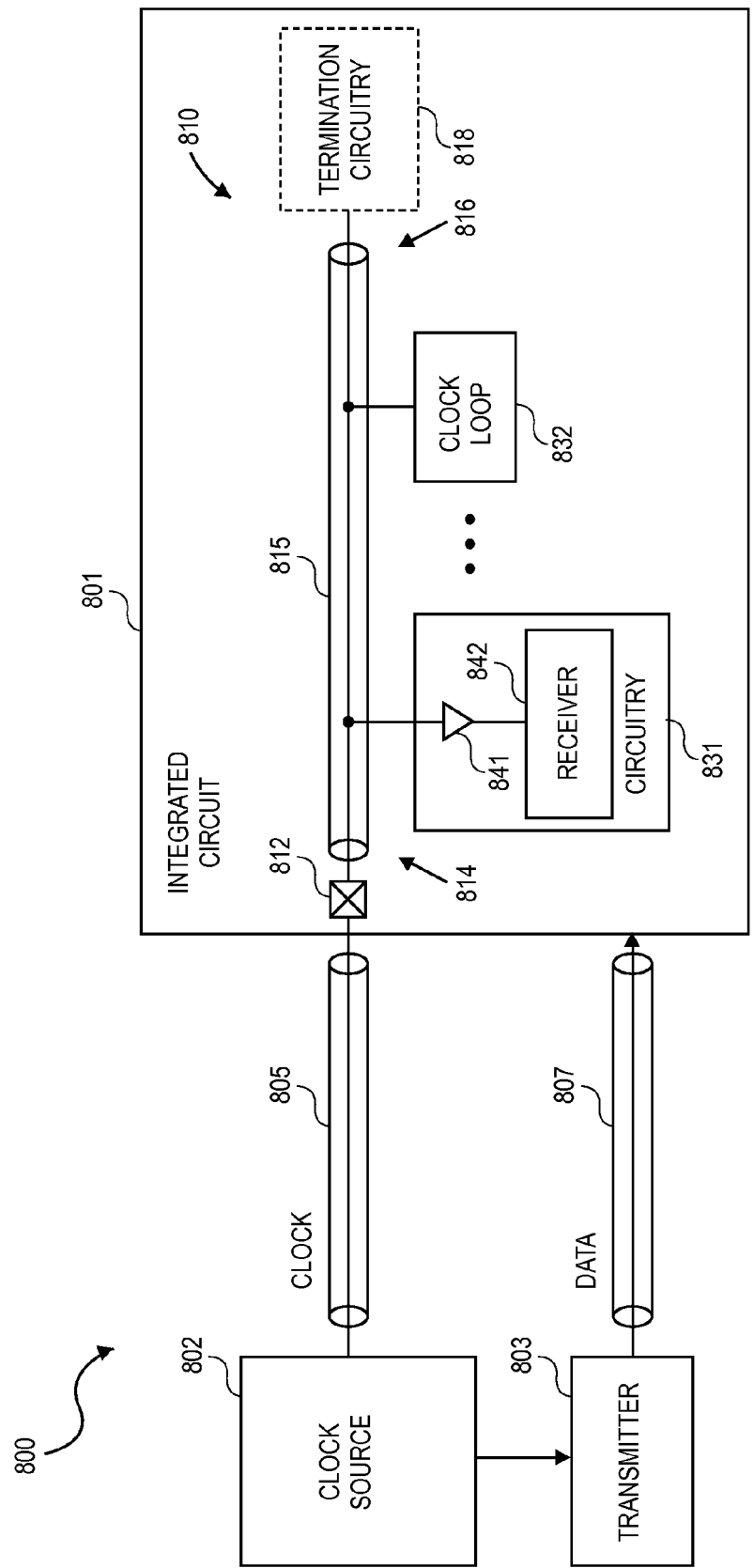
FIG. 8 illustrates, for one embodiment, a passive signal distribution network to receive and distribute in an integrated circuit a clock signal transmitted by a clock source.

FIG. 8 illustrates, for one embodiment, a passive signal distribution network 810 to receive a clock signal transmitted by a clock source 802 over an external transmission line 805 and distribute the received clock signal in an integrated circuit 801. Clock source 802 for one embodiment may transmit a clock signal to integrated circuit 801 to implement system synchronous timing. Clock source 802 and integrated circuit 801 for one embodiment may form at least a portion of a system 800.

Integrated circuit 801 may be coupled to external transmission line 805 at an input node 812 to receive a clock signal from clock source 802. Integrated circuit 801 for one embodiment may comprise an internal transmission line 815 in one or more layers of integrated circuit 801. Internal transmission line 815 extends from an end 814 to another end 816. Internal transmission line 815 for one embodiment may receive a clock signal from external transmission line 805 without use of termination circuitry. Integrated circuit 801 may comprise circuitry having respective inputs coupled to internal transmission line 815 at different respective locations of internal transmission line 815 to receive a clock signal passively transmitted on internal transmission line 815. Integrated circuit 801 for one embodiment may optionally comprise termination circuitry 818 to inhibit signal reflection from end 816 of internal transmission line 815.

Components of system 800 of FIG. 8 generally correspond to those of system 300 of FIG. 3. The description relating to system 300 may generally apply to system 800 to the extent the description of system 300 is not inconsistent with the description of system 800.

Circuitry coupled to receive a clock signal from internal transmission line 815 for one embodiment may comprise a buffer to convert the received clock signal to a suitable level for use by such circuitry. As one example, circuitry 831 for one embodiment, as illustrated in FIG. 8, may comprise a buffer 841 coupled to receive a clock signal from internal transmission line 815 to convert the received clock signal to a suitable level for use by a receiver 842. Receiver 842 for one embodiment may be coupled to receive a clock signal from buffer 841 to help recover a data signal transmitted by a transmitter 803 over another external transmission line 807. Although described and illustrated as having one receiver 842 to help recover a data signal from one external transmission line 807 for one embodiment, integrated circuit 801 for one embodiment may comprise one or more additional receivers to help recover a data signal from external transmission line 807 and/or may comprise suitable circuitry to receive any suitable signal over one or more additional external transmission lines. Such circuitry may or may not be similar to that for circuitry 831.

Circuitry coupled to receive a clock signal from internal transmission line 815 for one embodiment may comprise a clock loop, such as a clock loop 832 for example, and/or an injection locked oscillator.

The description relating to system 700 may also generally apply to system 800 to the extent the description of system 700 is not inconsistent with the description of system 800.

Figure 9:
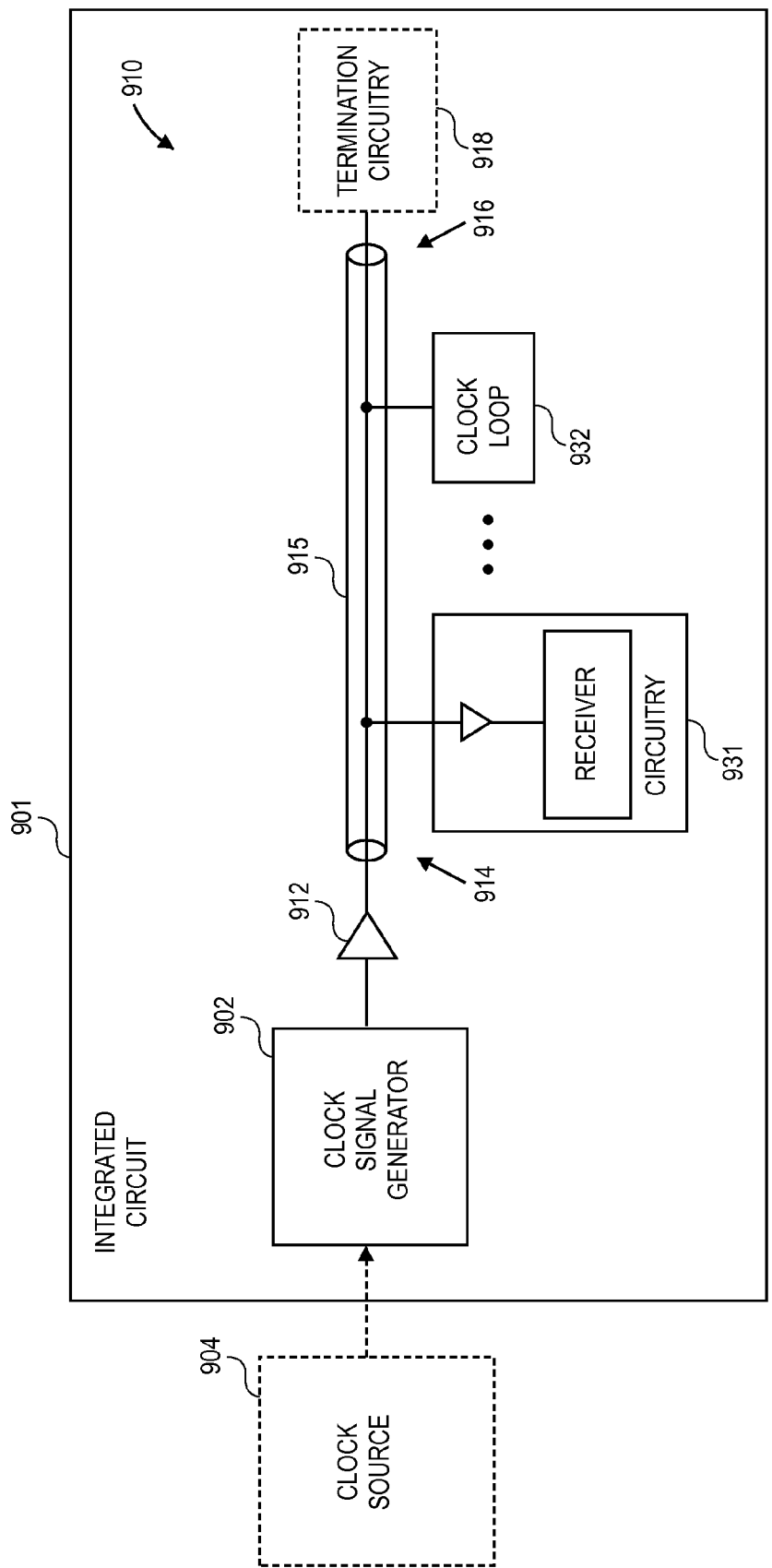
FIG. 9 illustrates, for one embodiment, a passive signal distribution network to distribute an internally generated clock signal in an integrated circuit.

FIG. 9 illustrates, for one embodiment, a passive signal distribution network 910 to distribute in an integrated circuit 901 a clock signal transmitted by a clock signal generator 902 of integrated circuit 901. Clock signal generator 902 for one embodiment may be coupled to receive a clock signal from a clock source 904 external to integrated circuit 901 and generate any suitable clock signal in any suitable manner based on the received clock signal. Passive signal distribution network 910 for one embodiment may be used for global clock distribution in integrated circuit 901.

Integrated circuit 901 for one embodiment may comprise an internal transmission line 915 in one or more layers of integrated circuit 901. Internal transmission line 915 extends from an end 914 to another end 916. Integrated circuit 901 for one embodiment may comprise a buffer 912 to drive a clock signal generated by clock signal generator 902 to internal transmission line 915. Integrated circuit 901 may comprise circuitry having respective inputs coupled to internal transmission line 915 at different respective locations of internal transmission line 915 to receive a clock signal passively transmitted on internal transmission line 915. Integrated circuit 901 for one embodiment may optionally comprise termination circuitry 918 to inhibit signal reflection from end 916 of internal transmission line 915.

Components of integrated circuit 901 of FIG. 9 generally correspond to those of integrated circuit 501 of FIG. 5. The description relating to integrated circuit 501 may generally apply to integrated circuit 901 to the extent the description of integrated circuit 501 is not inconsistent with the description of integrated circuit 901.

Integrated circuit 901 may comprise any suitable circuitry, such as circuitry 931, clock loop 932, and/or an injection locked oscillator for example, coupled to receive a clock signal from internal transmission line 915. The description relating to integrated circuit 701 of FIG. 7 may also generally apply to integrated circuit 901 to the extent the description of integrated circuit 701 is not inconsistent with the description of integrated circuit 901.

Passive Distribution of Data Signal

Figure 10:
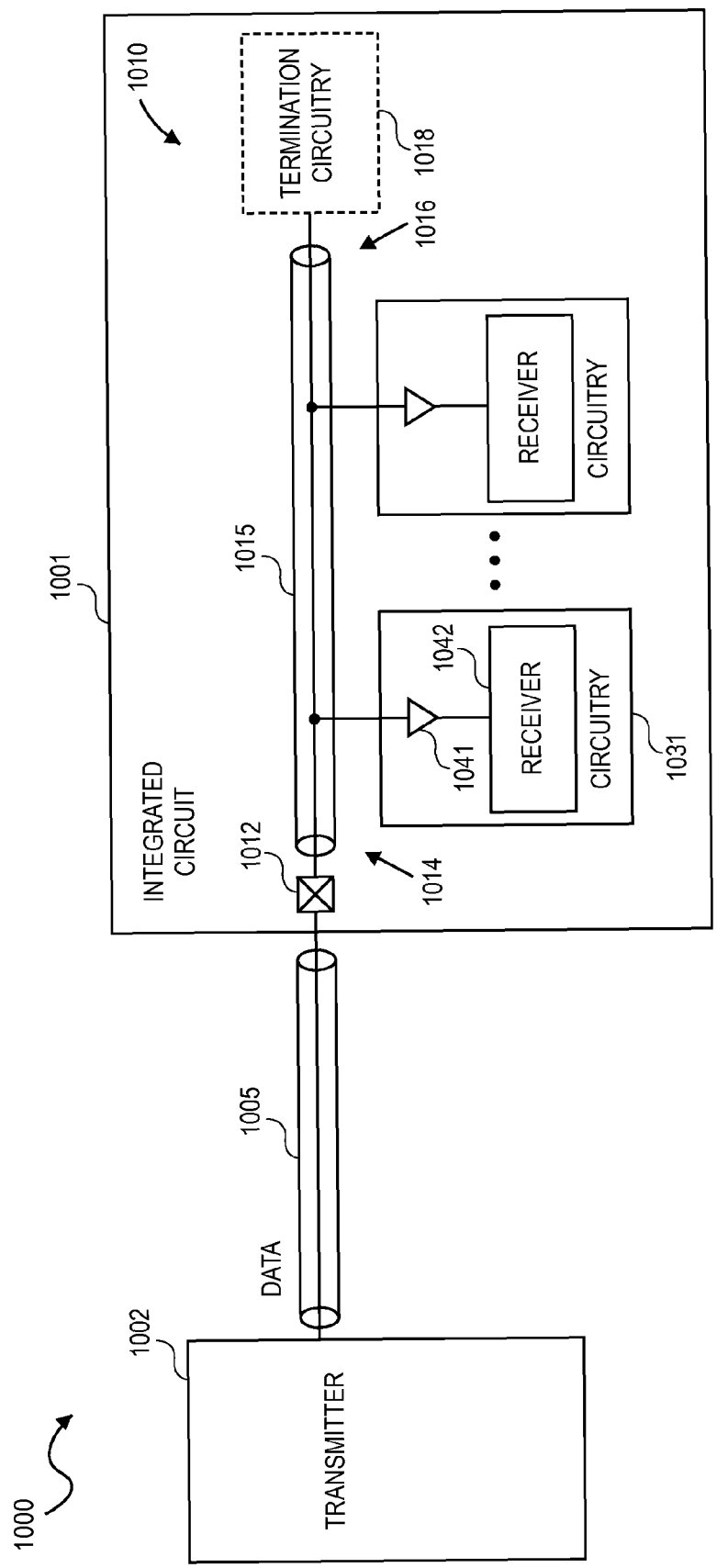
FIG. 10 illustrates, for one embodiment, a passive signal distribution network to receive and distribute in an integrated circuit a data signal transmitted by a transmitter.

FIG. 10 illustrates, for one embodiment, a passive signal distribution network 1010 to receive a data signal transmitted by a transmitter 1002 over an external transmission line 1005 and distribute the received data signal in an integrated circuit 1001. Transmitter 1002 and integrated circuit 1001 for one embodiment may form at least a portion of a system 1000.

Integrated circuit 1001 may be coupled to external transmission line 1005 at an input node 1012 to receive a data signal from transmitter 1002. Integrated circuit 1001 for one embodiment may comprise an internal transmission line 1015 in one or more layers of integrated circuit 1001. Internal transmission line 1015 extends from an end 1014 to another end 1016. Internal transmission line 1015 for one embodiment may receive a data signal from external transmission line 1005 without use of termination circuitry. Integrated circuit 1001 may comprise circuitry having respective inputs coupled to internal transmission line 1015 at different respective locations of internal transmission line 1015 to receive a data signal passively transmitted on internal transmission line 1015. Integrated circuit 1001 for one embodiment may optionally comprise termination circuitry 1018 to inhibit signal reflection from end 1016 of internal transmission line 1015.

Components of system 1000 of FIG. 10 generally correspond to those of system 300 of FIG. 3. The description relating to system 300 may generally apply to system 1000 to the extent the description of system 300 is not inconsistent with the description of system 1000.

Circuitry coupled to receive a data signal from internal transmission line 1015 for one embodiment may comprise a buffer to convert the received data signal to a suitable level for use by such circuitry. As one example, circuitry 1031 as illustrated in FIG. 10 may comprise a buffer 1041 coupled to receive a data signal from internal transmission line 1015 to convert the received data signal to a suitable level for use by a receiver 1042. Receiver 1042 for one embodiment may be coupled to receive a data signal from buffer 1041.

Electrostatic Discharge Protection

Figure 11:
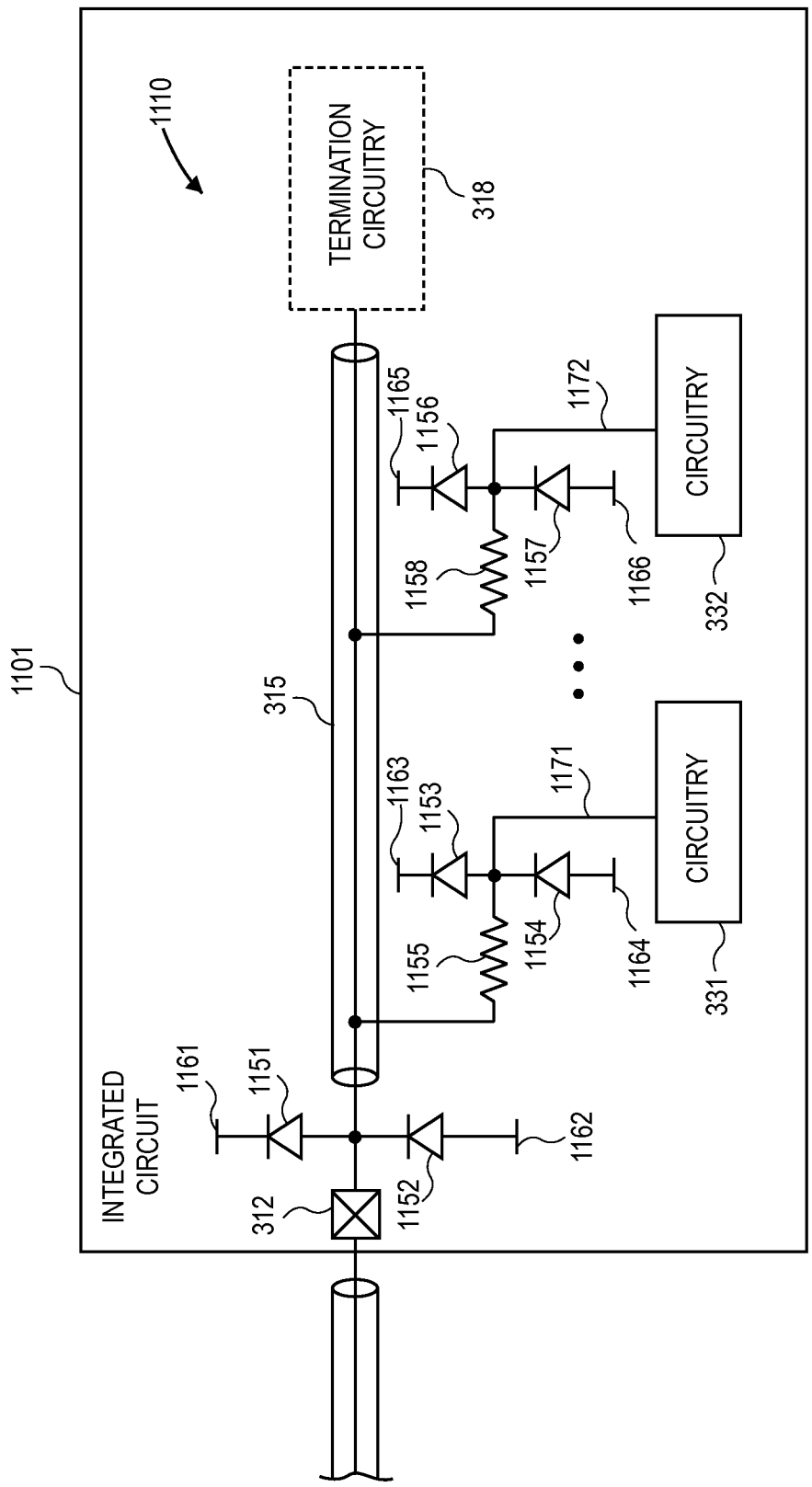
FIG. 11 illustrates, for one embodiment, a passive signal distribution network having electrostatic discharge protection circuitry.

FIG. 11 illustrates, for one embodiment, an integrated circuit 1101 comprising passive signal distribution network 310 of FIG. 3 with electrostatic discharge (ESD) protection circuitry to form a passive signal distribution network 1110.

As illustrated in FIG. 11, integrated circuit 1101 for one embodiment may comprise a diode 1151 coupled between internal transmission line 315 and a supply node 1161 and a diode 1152 coupled between internal transmission line 315 and a reference supply node 1162, such as ground for example. For one embodiment, diodes 1151 and 1152 may be coupled to internal transmission line 315 close to input node 312.

Integrated circuit 1101 for one embodiment may also comprise a diode 1153, a diode 1154, and a resistor 1155 along a transmission line 1171 coupled between internal transmission line 315 and circuitry 331. Diode 1153 may be coupled between transmission line 1171 and a supply node 1163, and diode 1154 may be coupled between transmission line 1171 and a reference supply node 1164, such as ground for example. Resistor 1155 may be coupled in series with transmission line 1171.

Integrated circuit 1101 for one embodiment may also comprise a diode 1156, a diode 1157, and a resistor 1158 along a transmission line 1172 coupled between internal transmission line 315 and circuitry 332. Diode 1156 may be coupled between transmission line 1172 and a supply node 1165, and diode 1154 may be coupled between transmission line 1171 and a reference supply node 1166, such as ground for example. Resistor 1158 may be coupled in series with transmission line 1172.

Distributing diodes 1153, 1154, 1156, and 1157 and resistors 1155 and 1158 along internal transmission line 315 such that resistors 1155 and 1158 are not in series with internal transmission line 315 for one embodiment may help allow internal transmission line 315 to be designed with a desired impedance.

Diodes 1153, 1154, 1156, and 1157 for one embodiment may be small relative to diodes 1151 and 1152, and diodes 1151 and 1152 for one embodiment may be large relative to diodes 1153, 1154, 1156, and 1157. Diodes 1151, 1152, 1153, 1154, 1156, and 1157 and resistors 1155 and 1158 may be implemented in any suitable manner. Supply nodes 1161, 1163, and 1165 for one embodiment may be a common supply node. Reference supply nodes 1162, 1164, and 1166 for one embodiment may be a common reference supply node.

Although described in connection with circuitry 331 and 332, integrated circuit 1101 for one embodiment may comprise additional diodes and resistor(s) for additional circuitry coupled to internal transmission line 315.

Passive Distribution of Differential Signals

Figure 12:
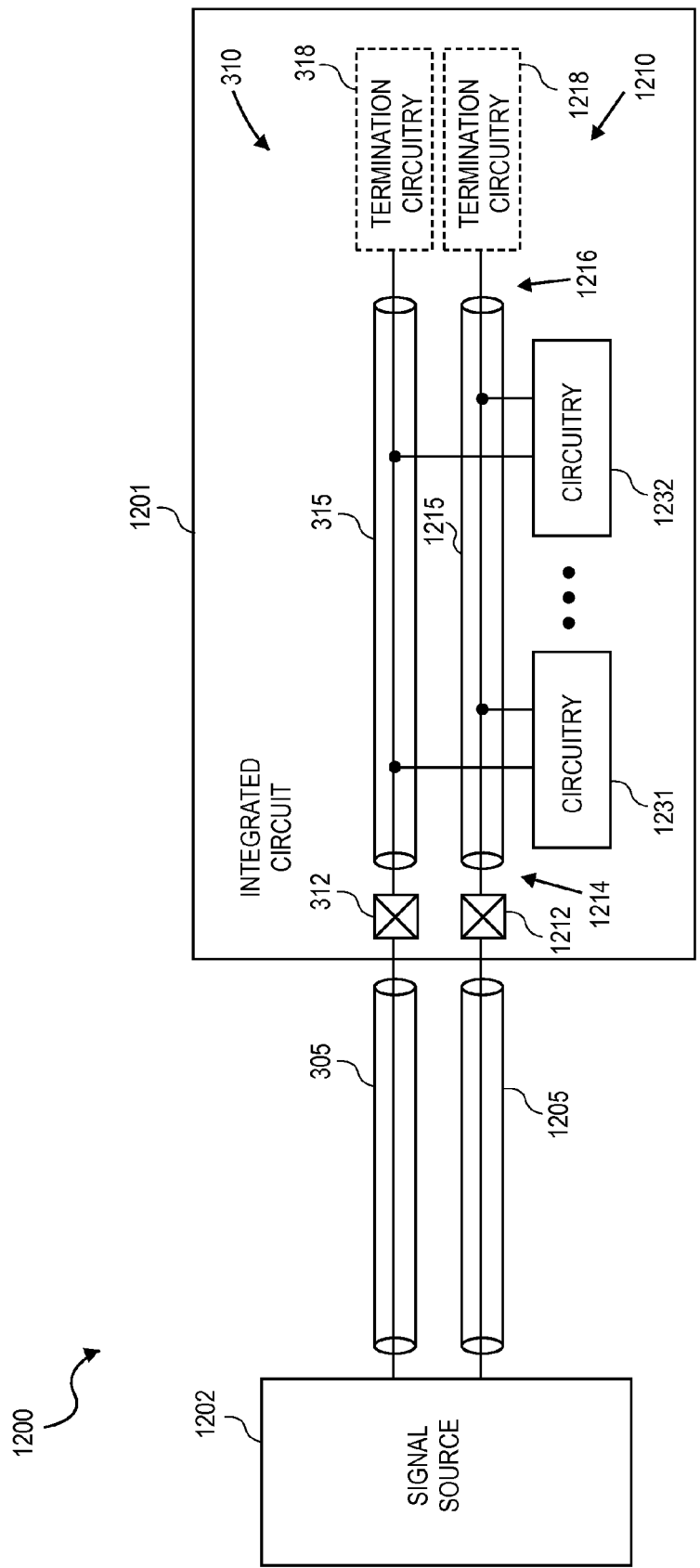
FIG. 12 illustrates, for one embodiment, a passive signal distribution network to receive and distribute externally generated differential signals in an integrated circuit.

FIG. 12 illustrates, for one embodiment, an integrated circuit 1201 comprising passive signal distribution network 310 of FIG. 3 with another passive signal distribution network 1210 to receive and distribute externally generated differential signals in integrated circuit 1201. Integrated circuit 1201 may be coupled to receive differential signals from a signal source 1202. Signal source 1202 may comprise any suitable circuitry to transmit any suitable differential signals over respective external transmission lines 305 and 1205 to integrated circuit 1201 at any suitable speed. Signal source 1202 for one embodiment may transmit differential clock signals over external transmission lines 305 and 1205 to integrated circuit 1201. Signal source 1202 for one embodiment may transmit differential data signals over external transmission lines 305 and 1205 to integrated circuit 1201. Signal source 1202 and integrated circuit 1201 for one embodiment may form at least a portion of a system 1200.

Integrated circuit 1201 may be coupled to external transmission line 1205 at an input node 1212 to receive one of the differential signals from signal source 1202. Integrated circuit 1201 for one embodiment may comprise an internal transmission line 1215 in one or more layers of integrated circuit 1201. Internal transmission line 1215 extends from an end 1214 to another end 1216. Internal transmission line 1215 for one embodiment may receive a signal from external transmission line 1205 without use of termination circuitry. Integrated circuit 1201 for one embodiment may optionally comprise termination circuitry 1218 to inhibit signal reflection from end 1216 of internal transmission line 1215.

Component(s) of passive signal distribution network 1210 of FIG. 12 generally correspond to those of passive signal distribution network 310 of FIG. 3. The description relating to passive signal distribution network 310 may generally apply to passive signal distribution network 1210 to the extent the description of passive signal distribution network 310 is not inconsistent with the description of passive signal distribution network 1210.

Integrated circuit 1201 may comprise circuitry 1231 having respective inputs coupled to internal transmission lines 315 and 1215 to receive differential signals passively transmitted on internal transmission lines 315 and 1215. Integrated circuit 1201 may also comprise circuitry 1232 having respective inputs coupled to internal transmission lines 315 and 1215 to receive differential signals passively transmitted on internal transmission lines 315 and 1215. Circuitry 1231 and 1232 may be coupled to internal transmission line 315 at any suitable different locations of internal transmission line 315 and may be coupled to internal transmission line 1215 at any suitable different locations of internal transmission line 1215. Although illustrated with circuitry 1231 and 1232 for one embodiment, integrated circuit 1201 for one embodiment may comprise circuitry having inputs coupled to internal transmission lines 315 and 1215 at any suitable number of three or more different respective locations.

Any suitable circuitry may have inputs coupled to internal transmission lines 315 and 1215 to receive differential signals passively transmitted on internal transmission lines 315 and 1215. Such circuitry may recover the received differential signals passively transmitted on internal transmission lines 315 and 1215 for any suitable purpose. Such circuitry for one embodiment may comprise buffers to convert received differential signals to a suitable level for use by such circuitry. Such circuitry for one embodiment may comprise a clock loop and/or an injection locked oscillator to receive differential clock signals.

Although one embodiment is described and illustrated as distributing externally generated differential signals, an integrated circuit for one embodiment may comprise passive signal distribution network 510 of FIG. 5 with another passive signal distribution network to distribute internally generated differential signals. Such an integrated circuit for one embodiment may comprise a signal generator to generate differential signals. Such an integrated circuit for one embodiment may also comprise buffers to drive such differential signals to both passive signal distribution networks. The description relating to integrated circuit 501 and/or to integrated circuit 1201 may generally apply to such an integrated circuit to the extent the description of integrated circuit 501 and/or integrated circuit 1201 is not inconsistent.

Passive, Branched Distribution of Signals

Figure 13:
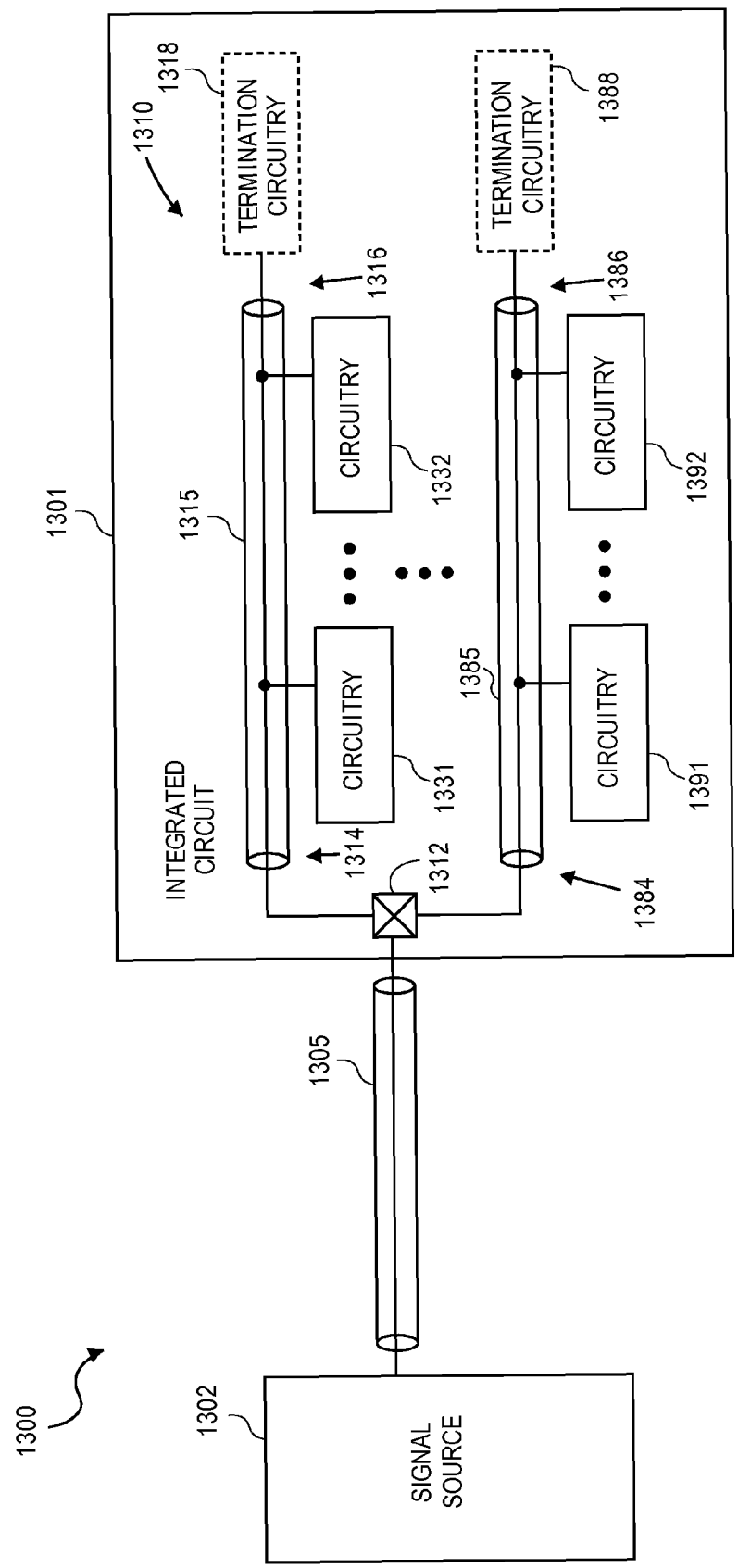
FIG. 13 illustrates, for one embodiment, a passive, branched signal distribution network to receive and distribute externally generated signals in an integrated circuit.

FIG. 13 illustrates, for one embodiment, a passive, branched signal distribution network 1310 to receive a signal transmitted by a signal source 1302 over an external transmission line 1305 and distribute the received signal in an integrated circuit 1301. Signal source 1302 and integrated circuit 1301 for one embodiment may form at least a portion of a system 1300.

Integrated circuit 1301 may be coupled to external transmission line 1305 at an input node 1312 to receive a signal from signal source 1302. Integrated circuit 1001 for one embodiment may comprise an internal transmission line 1315 in one or more layers of integrated circuit 1301 and another internal transmission line 1385 in one or more layers of integrated circuit 1301. Internal transmission line 1315 extends from an end 1314 to another end 1316, and internal transmission line 1385 extends from an end 1384 to another end 1386. Internal transmission line 1315 for one embodiment may be coupled to receive a signal from external transmission line 1305 at end 1314 of internal transmission line 1315 to transmit the signal passively to end 1316 of internal transmission line 1315. Internal transmission line 1385 for one embodiment may also be coupled to receive the signal from external transmission line 1305 at end 1384 of internal transmission line 1385 to transmit the signal passively to end 1386 of internal transmission line 1385. Ends 1314 and 1384 for one embodiment, as illustrated in FIG. 13, may be coupled in common to input node 1312.

Internal transmission lines 1315 and 1385 for one embodiment may receive a signal from external transmission line 1305 without use of termination circuitry. Internal transmission lines 1315 and 1385 for one embodiment may have combined impedance relative to an impedance of external transmission line 1305 to inhibit signal reflection as a signal passes from external transmission line 1305 to internal transmission lines 1315 and 1385. Internal transmission lines 1315 and 1385 for one embodiment may have combined impedance approximately equal to the characteristic impedance of external transmission line 1305.

Integrated circuit 1301 may comprise circuitry, such as circuitry 1331 and 1332 for example, having a respective input coupled to internal transmission line 1315 at one or more locations of internal transmission line 1315 to receive a signal passively transmitted on internal transmission line 1315. Integrated circuit 1301 may also comprise circuitry, such as circuitry 1391 and 1392 for example, having a respective input coupled to internal transmission line 1385 at one or more locations of internal transmission line 1385 to receive a signal passively transmitted on internal transmission line 1385. Although illustrated as having circuitry at two locations for one embodiment, internal transmission lines 1315 and 1385 for one embodiment may each have circuitry coupled to receive a signal at any suitable number of one or more locations.

Integrated circuit 1301 for one embodiment may optionally comprise termination circuitry 1318 to inhibit signal reflection from end 1316 of internal transmission line 1315. Termination circuitry 1318 for one embodiment may have impedance relative to an impedance of internal transmission line 1315 to inhibit signal reflection from end 1316 of internal transmission line 1315. Termination circuitry 1318 for one embodiment may have impedance approximately equal to the characteristic impedance of internal transmission line 1315.

Integrated circuit 1301 for one embodiment may optionally comprise termination circuitry 1388 to inhibit signal reflection from end 1386 of internal transmission line 1385. Termination circuitry 1388 for one embodiment may have impedance relative to an impedance of internal transmission line 1385 to inhibit signal reflection from end 1386 of internal transmission line 1385. Termination circuitry 1388 for one embodiment may have impedance approximately equal to the characteristic impedance of internal transmission line 1385.

Integrated circuit 1301 for one embodiment may optionally comprise, for example, a power splitter or impedance transformer at or near input node 1312 to help allow internal transmission lines 1315 and 1385 to be designed relatively more freely, for example, with a desired impedance.

Components of system 1300 of FIG. 13 generally correspond to those of system 300 of FIG. 3. The description relating to system 300 may generally apply to system 1300 to the extent the description of system 300 is not inconsistent with the description of system 1300.

Although described and illustrated as having two internal transmission lines 1315 and 1385 coupled to receive a signal from external transmission line 1305, integrated circuit 1301 for one embodiment may comprise any suitable number of internal transmission lines coupled to receive a signal from external transmission line 1305. One or more of such internal transmission lines may have circuitry coupled to receive a signal at any suitable number of one or more locations. Such internal transmission lines for one embodiment may receive a signal from external transmission line 1305 without use of termination circuitry. Such internal transmission lines for one embodiment may have combined impedance relative to an impedance of external transmission line 1305 to inhibit signal reflection as a signal passes from external transmission line 1305 to such internal transmission lines.

Although one embodiment is described and illustrated as distributing externally generated signals, an integrated circuit for one embodiment may comprise a similar passive, branched signal distribution network to distribute internally generated signals. Such an integrated circuit for one embodiment may comprise a signal generator to generate a signal. Such an integrated circuit for one embodiment may also comprise a buffer to drive such a signal to the passive, branched signal distribution network. The description relating to integrated circuit 501 and/or to integrated circuit 1301 may generally apply to such an integrated circuit to the extent the description of integrated circuit 501 and/or integrated circuit 1301 is not inconsistent.

Example System

Passive signal distribution network 310, 510, 710, 810, 910, 1010, 1110, 1210, and/or 1310 may be used to distribute signal(s) in any suitable integrated circuit comprising any suitable circuitry to perform any suitable function(s). Such an integrated circuit may form at least a portion of any suitable system.

Figure 14:
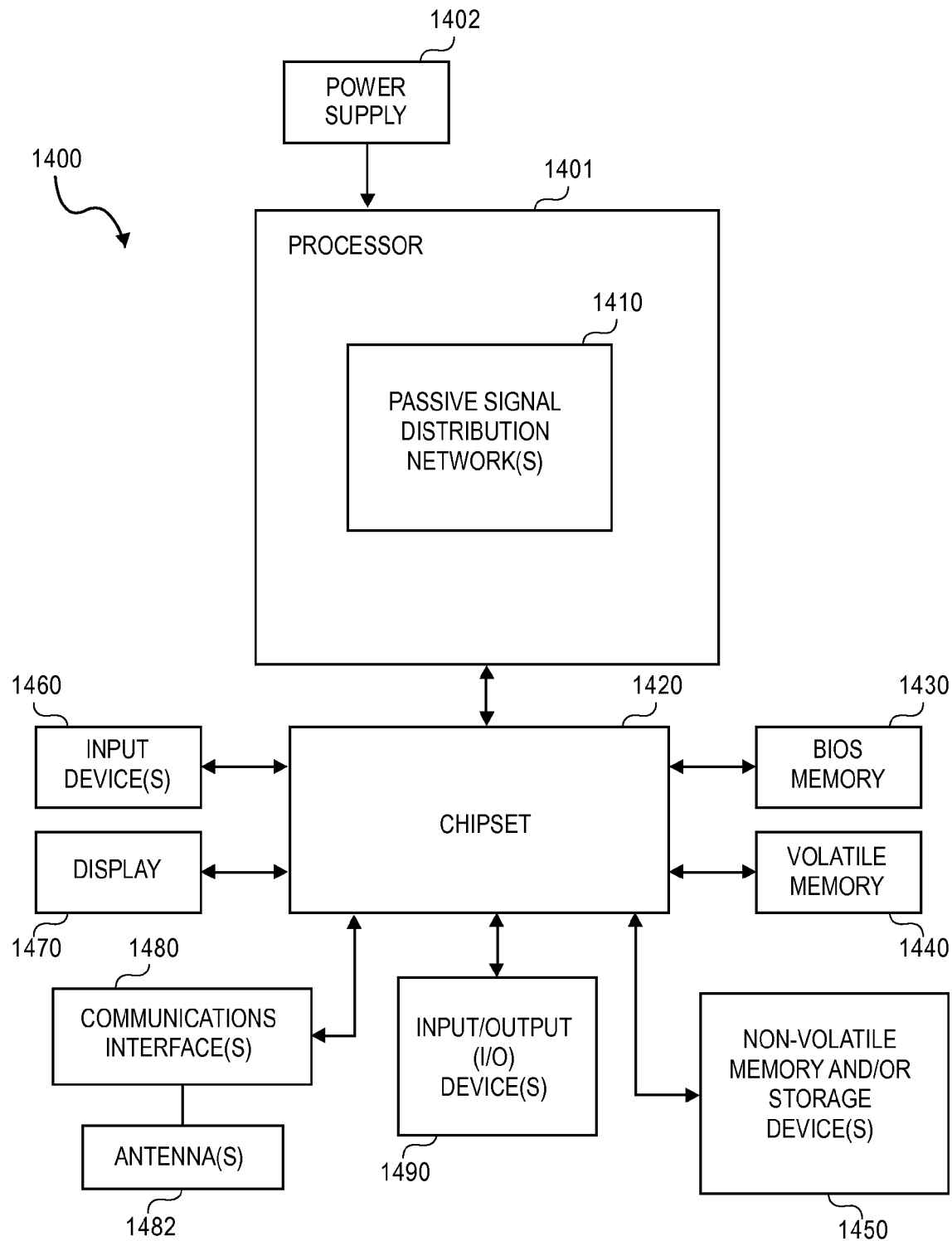
FIG. 14 illustrates, for one embodiment, an example system comprising a processor having a passive signal distribution network to distribute a signal in the processor.

FIG. 14 illustrates, for one embodiment, an example system 1400 comprising a processor 1401 having one or more passive signal distribution networks 1410 to distribute signal(s) in an integrated circuit of processor 1401. Passive signal distribution network(s) 1410 for one embodiment may generally correspond to one or more of passive signal distribution networks 310, 510, 710, 810, 910, 1010, 1110, 1210, and/or 1310. The description relating to passive signal distribution networks 310, 510, 710, 810, 910, 1010, 1110, 1210, and/or 1310 may generally apply to passive signal distribution network(s) 1410 to the extent the description of passive signal distribution networks 310, 510, 710, 810, 910, 1010, 1110, 1210, and/or 1310 is not inconsistent with the description of passive signal distribution network(s) 1410.

Processor 1401 for one embodiment may use one or more of passive signal distribution network(s) 1410 to receive one or more signals generated by, for example, a chipset 1420 coupled to processor 1401 and to distribute such signal(s) in an integrated circuit of processor 1401. Processor 1401 for one embodiment may use one or more of passive signal distribution network(s) 1410 to distribute one or more internally generated signals in an integrated circuit of processor 1401. Although described in connection with an integrated circuit for processor 1401, passive signal distribution network(s) 1410 for one embodiment may be used to distribute signal(s) in an integrated circuit of any suitable device or component of system 1400.

Processor 1401 for one embodiment may be coupled to receive power from a power supply 1402 to provide power to at least circuitry coupled to receive a signal distributed by passive signal distribution network(s) 1410. Power supply 1402 for one embodiment may include a battery. Power supply 1402 for one embodiment may include an alternating current to direct current (AC-DC) converter. Power supply 1402 for one embodiment may include a DC-DC converter. Power supply 1402 for one embodiment may include one or more voltage regulators to help supply power to processor 1401.

System 1400 for one embodiment may also comprise, in addition to processor 1401 and chipset 1420, a basic input/output system (BIOS) memory 1430 coupled to chipset 1420, volatile memory 1440 coupled to chipset 1420, non-volatile memory and/or storage device(s) 1450 coupled to chipset 1420, one or more input devices 1460 coupled to chipset 1420, a display 1470 coupled to chipset 1420, one or more communications interfaces 1480 coupled to chipset 1420, and/or one or more other input/output (I/O) devices 1490 coupled to chipset 1420.

Chipset 1420 for one embodiment may comprise any suitable interface controllers to provide for any suitable communications link to processor 1401 and/or to any suitable device or component in communication with chipset 1420.

Chipset 1420 for one embodiment may comprise a firmware controller to provide an interface to BIOS memory 1430. BIOS memory 1430 may be used to store any suitable system and/or video BIOS software for system 1400. BIOS memory 1430 may comprise any suitable non-volatile memory, such as a suitable flash memory for example. BIOS memory 1430 for one embodiment may alternatively be included in chipset 1420.

Chipset 1420 for one embodiment may comprise one or more memory controllers to provide an interface to volatile memory 1440. Volatile memory 1440 may be used to load and store data and/or instructions, for example, for system 1400. Volatile memory 1440 may comprise any suitable volatile memory, such as suitable dynamic random access memory (DRAM) for example.

Chipset 1420 for one embodiment may comprise a graphics controller to provide an interface to display 1470. Display 1470 may comprise any suitable display, such as a cathode ray tube (CRT) or a liquid crystal display (LCD) for example. The graphics controller for one embodiment may alternatively be external to chipset 1420.

Chipset 1420 for one embodiment may comprise one or more input/output (I/O) controllers to provide an interface to non-volatile memory and/or storage device(s) 1450, input device(s) 1460, communications interface(s) 1480, and/or I/O devices 1490.

Non-volatile memory and/or storage device(s) 1450 may be used to store data and/or instructions, for example. Non-volatile memory and/or storage device(s) 1450 may comprise any suitable non-volatile memory, such as flash memory for example, and/or may comprise any suitable non-volatile storage device(s), such as one or more hard disk drives (HDDs), one or more compact disc (CD) drives, and/or one or more digital versatile disc (DVD) drives for example.

Input device(s) 1460 may comprise any suitable input device(s), such as a keyboard, a mouse, and/or any other suitable cursor control device.

Communications interface(s) 1480 may provide an interface for system 1400 to communicate over one or more networks and/or with any other suitable device. Communications interface(s) 1480 may comprise any suitable hardware and/or firmware. Communications interface(s) 1480 for one embodiment may comprise, for example, a network adapter, a wireless network adapter, a telephone modem, and/or a wireless modem. For wireless communications, communications interface(s) 1480 for one embodiment may use one or more antennas 1482.

I/O device(s) 1490 may comprise any suitable I/O device(s) such as, for example, an audio device to help convert sound into corresponding digital signals and/or to help convert digital signals into corresponding sound, a camera, a camcorder, a printer, and/or a scanner.

Although described as residing in chipset 1420, one or more controllers of chipset 1420 may be integrated with processor 1401, allowing processor 1401 to communicate with one or more devices or components directly. As one example, one or more memory controllers for one embodiment may be integrated with processor 1401, allowing processor 1401 to communicate with volatile memory 1440 directly.

In the foregoing description, example embodiments have been described. Various modifications and changes may be made to such embodiments without departing from the scope of the appended claims. The description and drawings are, accordingly, to be regarded in an illustrative rather than a restrictive sense.

We claim:

1. An integrated circuit (IC) comprising:
   a first electrostatic discharge (ESD) protection unit to receive a signal;
   a passive transmission line (TL) coupled to the first ESD protection unit to receive the signal at a first end of the passive TL; and
   a second ESD protection unit coupled to the passive TL at a first location of the passive TL, the first end being different from the first location of the passive TL.

2. The IC of claim 1 further comprises a first circuit coupled to the second ESD protection unit.

3. The IC of claim 2, wherein the second ESD protection unit is smaller in size than the first ESD protection circuit, and wherein the second ESD protection unit is closer to the first circuit than the first ESD protection unit is from the first circuit.

4. The IC of claim 1, wherein the first ESD protection unit is located closer to an input-output (I/O) pad than the second ESD protection unit is from the I/O pad.

5. The IC of claim 1, wherein the first end of the passive TL is independent of a termination unit.

6. The IC of claim 1 further comprises a termination unit at a second end of the passive TL, the second end being different from the first end of the passive TL.

7. The IC of claim 1 further comprises:
   a third ESD protection unit coupled to the passive TL at a second location of passive TL, the second location being different from the first location; and
   a second circuit coupled to the third ESD protection unit.

8. The IC of claim 1 further comprises a first resistor coupled at one end to the first location of the passive TL and coupled at another end to the second ESD protection unit.

9. The IC of claim 1, wherein the second ESD protection unit comprises a diode which is smaller in size than a diode of the first ESD protection unit.

10. A system comprising:
   a battery;
   a first processor to generate a signal; and
   a second processor coupled to the battery, the second processor including:
      a first electrostatic discharge (ESD) protection unit to receive the signal from the first processor;
      a passive transmission line (TL) coupled to the first ESD protection unit to receive the signal at a first end of the passive TL;
      a second ESD protection unit coupled to the passive TL at a first location of the passive TL; and
      a first circuit coupled to the second ESD protection unit.

11. The system of claim 10 further comprises a wireless interface coupled to the second processor to communicatively link the second processor with another device.

12. The system of claim 10 further comprises a display unit.

13. The system of claim 10, wherein the first ESD protection unit is located closer to an input-output (I/O) pad of the second processor than the second ESD protection unit is from the I/O pad.

14. The system of claim 10, wherein the first end of the passive TL is independent of a termination unit.

15. The system of claim 10, wherein the second processor further comprises a termination unit at a second end of the passive TL, the second end being different from the first end of the passive TL.

16. The system of claim 10, wherein the second processor further comprises:
   a third ESD protection unit coupled to the passive TL at a second location of passive TL, the second location being different for the first location; and
   a second circuit coupled to the third ESD protection unit.

17. The system of claim 10, wherein the second ESD protection unit comprises a diode which is smaller in size than a diode of the first ESD protection unit.

18. An integrated circuit (IC) comprising:
   a first passive transmission line (TL) to receive at its first end a clock signal from another processor external to the IC;
   a second passive TL to receive at its first end a data signal from the other processor, the data signal being synchronized with reference to the clock signal; and
   a first circuit having an input node coupled to the first passive TL at a first location of the first passive TL to receive the clock signal, the clock signal for recovering data from the received data signal, wherein the first ends of the first and second passive TLs are independent of a termination unit.

19. The IC of claim 18 further comprises a second circuit having an input node coupled to the first passive TL at a second location of the first passive TL to receive the clock signal, wherein the second location is different from the first location.

20. The IC of claim 18, wherein the clock signal and the data signal are transmitted by a transmitter of the other processor over a first and second transmission media coupled to the first and second passive TLs respectively.

\* \* \* \* \*